(12) United States Patent
Otsuka et al.

(10) Patent No.: US 9,735,774 B2
(45) Date of Patent: Aug. 15, 2017

(54) CAPACITIVE LOAD DRIVING CIRCUIT

(71) Applicant: SEIKO EPSON CORPORATION, Tokyo (JP)

(72) Inventors: Shuji Otsuka, Nagano (JP); Tadashi Kiyuna, Tokyo (JP); Toshifumi Asanuma, Tokyo (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/137,385

(22) Filed: Apr. 25, 2016

(65) Prior Publication Data

US 2016/0241237 A1    Aug. 18, 2016

Related U.S. Application Data

(63) Continuation of application No. 14/205,889, filed on Mar. 12, 2014, now Pat. No. 9,346,264.

(30) Foreign Application Priority Data

Mar. 22, 2013  (JP) ................................. 2013-059205

(51) Int. Cl.
*H03K 17/687* (2006.01)
*B41J 2/045* (2006.01)
*H03K 3/28* (2006.01)
*B41J 2/07* (2006.01)
*B41J 29/38* (2006.01)

(52) U.S. Cl.
CPC ........ *H03K 17/6871* (2013.01); *B41J 2/0459* (2013.01); *B41J 2/04541* (2013.01); *B41J 2/04581* (2013.01); *B41J 2/04586* (2013.01); *B41J 2/04588* (2013.01); *B41J 2/07* (2013.01); *B41J 29/38* (2013.01); *H03K 3/28* (2013.01)

(58) Field of Classification Search
CPC .. B41J 2/0458; B41J 2/04563; B41J 2/04581; B41J 29/393; B41J 2/04586; B41J 29/38; H03K 17/6871; H03K 3/28
See application file for complete search history.

(56) References Cited

U.S. PATENT DOCUMENTS

| 7,852,128 B2 | 12/2010 | Kitazawa et al. |
| 9,346,264 B2 * | 5/2016 | Otsuka ...................... B41J 2/07 |
| 2010/0103211 A1 | 4/2010 | Miyazaki et al. |

(Continued)

FOREIGN PATENT DOCUMENTS

| JP | 2004-153411 A | 5/2004 |
| JP | 2009-190287 A | 8/2009 |

(Continued)

*Primary Examiner* — Julian Huffman
(74) *Attorney, Agent, or Firm* — Global IP Counelors, LLP

(57) ABSTRACT

A capacitive load driving circuit for repeating between charging and discharging for a capacitive load includes a charge supply source, a first signal path through which a first voltage is applied by the charge supply source, a second signal path through which a second voltage higher than the first voltage is applied by the charge supply source, and a connection path selector configured to electrically connect the capacitive load and the charge supply source via at least one of the first signal path and the second signal path, in accordance with a control signal. The charge supply source is arranged and configured to supply voltage to the connection path selection section.

6 Claims, 14 Drawing Sheets

(56) References Cited

U.S. PATENT DOCUMENTS

| | | | |
|---|---|---|---|
| 2011/0018919 A1* | 1/2011 | Oshima | B41J 2/04541 347/9 |
| 2011/0090273 A1 | 4/2011 | Miyazaki et al. | |
| 2012/0146451 A1 | 6/2012 | Nitta | |
| 2012/0229541 A1 | 9/2012 | Satoh et al. | |

FOREIGN PATENT DOCUMENTS

| | | |
|---|---|---|
| JP | 2010-099980 A | 5/2010 |
| JP | 2010-114711 A | 5/2010 |

\* cited by examiner

CAPACITIVE LOAD DRIVING CIRCUIT

CROSS-REFERENCE TO RELATED APPLICATIONS

This is a continuation application of U.S. patent application Ser. No. 14/205,889, filed on Mar. 12, 2014, which claims priority to Japanese Patent Application No. 2013-059205 filed on Mar. 22, 2013. The entire disclosures of U.S. patent application Ser. No. 14/205,889 and Japanese Patent Application No. 2013-059205 are hereby incorporated herein by reference.

BACKGROUND

Technical Field

The present invention relates to a capacitive load driving circuit.

Related Art

One known inkjet printer for discharging ink to print an image or document uses piezoelectric elements (for example, piezo elements). The piezoelectric elements are provided so as to respectively correspond to a plurality of nozzles in a print head and each, by being driven in conformity with a control signal, causes a predetermined amount of ink to be discharged from the nozzles at a predetermined timing. The piezoelectric elements, when viewed electrically, are a capacitive load similar to a capacitor, and therefore a sufficient electrical current needs to be supplied in order to actuate the piezoelectric elements of each of the nozzles.

For this reason, a conventional configuration has been to amplify an original signal with an amplifier circuit and supply the amplified control signal to the print head to drive the piezoelectric elements. Amplifier circuits include a format where the original signal undergoes electrical current amplification with a class AB or the like (linear amplification; see Japanese laid-open patent publication 2009-190287), or a format where the original signal is modulated by pulse width modulation, pulse density modulation, or the like, and then demodulated with a low-pass filter (class D amplification; see Japanese laid-open patent publication 2010-114711), and so forth.

Beyond amplifying the original signal with an amplifier circuit, a format in which the voltage applied to the piezoelectric elements is switched at a plurality of stages (voltage switching format; see Japanese laid-open patent publication 2004-153411) has also been proposed.

SUMMARY

However, linear amplification consumes a considerable amount of power, and has poor energy efficiency. Class D amplification does have better energy efficiency compared to linear amplification, but is problematic in that switching a large current at a high frequency creates electromagnetic interference (EMI). The voltage switching format described above, too, makes it possible to conserve power, but because of the stepwise switching of the voltage applied to the piezoelectric elements every time a pulse signal (CK) is inputted, a voltage other than a plurality of voltages that are prepared in advance cannot be selected for the start voltage and end voltage of the voltage waveform applied to the piezoelectric elements. For this reason, the voltage switching format described above is problematic in that it is difficult to finely control the piezoelectric elements.

Therefore, one objective of several modes of the present invention is to provide a capacitive load driving circuit with which energy efficiency is high, the occurrence of EMI is reduced, and a capacitive load such as piezoelectric elements is finely controlled.

A capacitive load driving circuit for repeating between charging and discharging for a capacitive load according to one aspect includes a charge supply source, a first signal path through which a first voltage is applied by the charge supply source, a second signal path through which a second voltage higher than the first voltage is applied by the charge supply source, and a connection path selector configured to electrically connect the capacitive load and the charge supply source via at least one of the first signal path and the second signal path, in accordance with a control signal. The charge supply source is arranged and configured to supply voltage to the connection path selection section.

BRIEF DESCRIPTION OF THE DRAWINGS

Referring now to the attached drawings which form a part of this original disclosure.

DETAILED DESCRIPTION OF EXEMPLARY EMBODIMENTS

Embodiments for carrying out the present invention shall be described below with reference to the accompanying drawings.

Overall Configuration of Print Apparatus

A print apparatus as in an embodiment of the present invention is an inkjet printer, i.e., a liquid discharge apparatus, which forms groups of ink dots on a recording medium such as paper, by discharging a liquid ink so as to correspond to image data supplied from a host computer, and thereby prints an image (includes text, graphics, and the like) corresponding to the image data.

Figure 1:
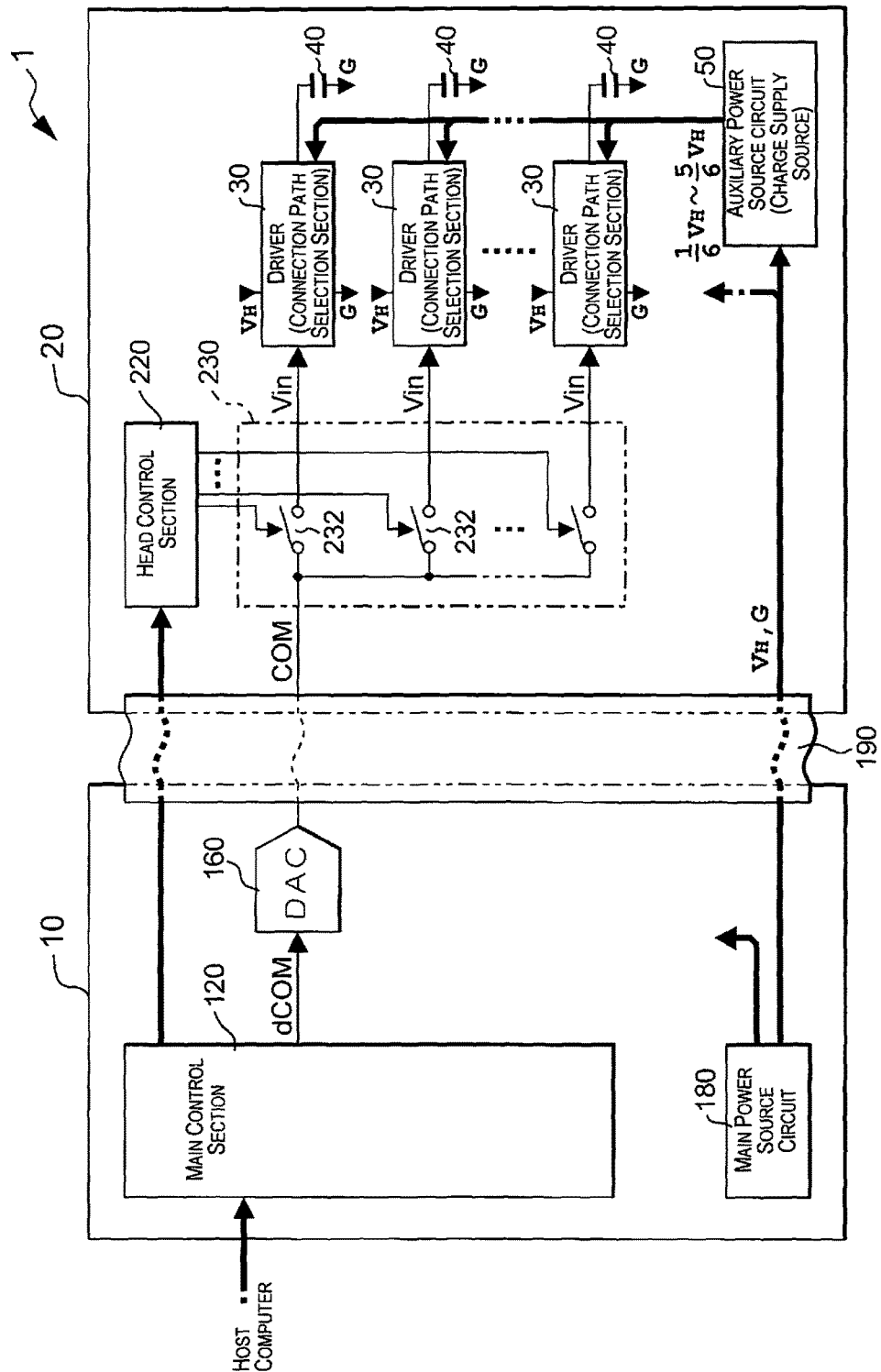
FIG. 1 is a drawing illustrating a schematic configuration of a print apparatus.

FIG. 1 is a drawing illustrating a schematic configuration of a print apparatus 1.

As is illustrated in FIG. 1, the print apparatus 1 has a configuration comprising a control unit 10 for executing a computation process for printing an image on the basis of image data supplied from a host computer, and a print head 20 having a plurality of nozzles. The control unit 10 and the print head 20 are electrically connected together via a flexible cable 190. The print head 20 is mounted onto a carriage (not shown) that can be moved in a direction (main scanning direction) substantially orthogonal to a direction of feeding (secondary scanning direction) of the recording medium.

The control unit 10 comprises a main control section 120, a digital-to-analog converter (DAC) 160, and a main power source circuit 180.

The main control section 120 generates a plurality of types of signals for causing ink to be discharged from the nozzles of the print head 20, by executing computation processes for printing, such as an image development process, color conversion process, ink color separation process, or halftoning process, on the basis of image data acquired from the host computer. Included in the plurality of types of signals are digital control data dCOM supplied from the DAC 160 and a variety of signals supplied to a head control section 220 (described below).

The contents of each of the computation processes for printing executed by the main control section 120 are well-known matters in the technical field of print apparatuses, and thus a description is omitted. The print apparatus 1, in turn, comprises a carriage motor for moving the carriage onto which the print head 20 is mounted in the main scanning direction, a conveyance motor for conveying the recording medium in the secondary scanning direction, and the like, while the control unit 10 comprises a configuration for supplying drive signals to the motors; these configurations are likewise well-known matters, and thus a description is omitted.

The DAC 160 converts the control data dCOM to an analog drive signal COM, which is then supplied to the print head 20.

The main power source circuit 180 supplies a power source voltage to each of the parts of the control unit 10 and to the print head 20. In particular, the main power source circuit 180, with respect to the print head 20, supplies a $V_H$ and G as power source voltages to the print head 20.

G (ground) is a ground potential, and serves as a reference of voltage zero in this description, unless otherwise noted. The voltage $V_H$ serves as a high side with respect to the ground G in the embodiment.

Though not depicted, one color or a plurality of colors of ink are supplied from an ink container via a flow path to the print head 20. The print head 20 comprises an auxiliary power source circuit 50, the head control section 220, and a selection section 230, in addition to a plurality of sets of drivers 30 and piezoelectric elements (piezo elements) 40.

The head control section 220 is for controlling the selection of the selection section 230 in conformity with the variety of signals supplied from the main control section 120.

The selection section 230 has switches 232 corresponding to each of the plurality of sets of drivers 30 and piezoelectric elements 40, each of the switches 232 being connected to one another at one end, with a communally supplied control signal COM, while the other ends are connected to input ends of the respectively corresponding drivers 30. Each of the switches 232 turns on and off in conformity with the control by the head control section 220, and supplies the control signals COM to the drivers 30 when turned on but blocks the control signals COM when turned off. For this reason, the selection section 230 selects the control signals COM supplied from the control unit 10 in conformity with the head control section 220, and supplies same to the drivers 30. For the sake of convenience of description, the notation Vin is used for those control signals, of the control signals COM, that are selected in conformity with the head control section 220 and supplied to the drivers 30.

The drivers 30 use the plurality of voltages supplied from the auxiliary power source circuit 50, and the power source voltages $V_H$, G, to drive the piezoelectric elements 40 in conformity with the control signals Vin supplied from the selection section 230.

One end of the piezoelectric elements 40 is connected to an output end of the corresponding driver 30, while the other ends of the piezoelectric elements 40 are communally connected to the ground G. For this reason, the voltage held in the piezoelectric elements 40 has a double meaning as output voltage of the drivers 30, and is therefore denoted as a voltage Vout.

The auxiliary power source circuit 50, the specific configuration of which shall be described below, uses a charge pump circuit to divide and reallocate the power source voltages $V_H$, G supplied from the main power source circuit 180, and thereby generates voltages $V_H/6$, $2V_H/6$, $3V_H/6$, $4V_H/6$, and $5V_H/6$, which are then communally supplied across the plurality of drivers 30.

As was described above, the piezoelectric elements 40 are provided so as to correspond to each of the plurality of nozzles in the print head 20, and driving thereof causes the ink to be discharged. Therefore, the configuration for causing the ink to be discharged by driving the piezoelectric elements 40 shall be described next.

Figure 2:
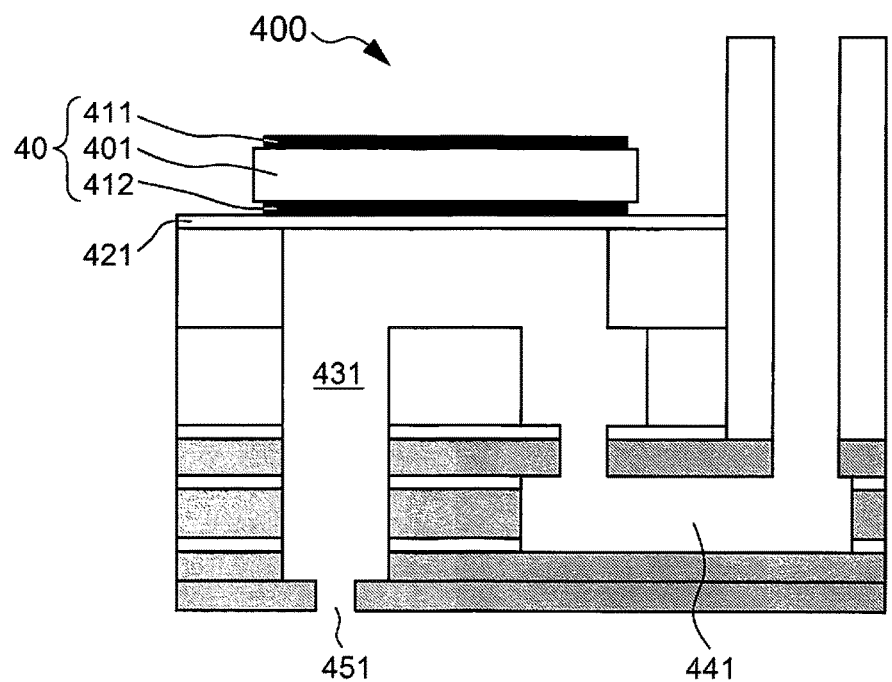
FIG. 2 is a drawing illustrating the principal configuration of a discharge section in a print head.

FIG. 2 is a drawing illustrating the schematic configuration of a discharge section 400 corresponding to one nozzle worth in the print head 20.

As illustrated in FIG. 2, the discharge section 400 comprises a piezoelectric element 40, a diaphragm 421, a cavity (pressure chamber) 431, a reservoir 441, and a nozzle 451. Of these, the diaphragm 421 is deformed by the piezoelectric element 40, which is provided to an upper surface in FIG. 2, and expands or reduces the internal volume of the cavity 431, which is filled with ink. The nozzle 451 is an opening that communicates with the cavity 431.

The piezoelectric element 40 illustrated in FIG. 2 is typically a structure called a unimorph (monomorph) type, in which a piezoelectric body 401 is interposed between a pair of electrodes 411, 412. In the piezoelectric body 401 of this structure, a middle portion in FIG. 2 is warped in the vertical direction, with respect to both end portions, along with the electrodes 411, 412 and the diaphragm 421 in accordance with a voltage applied between the electrodes 411, 412. Here, in upward warping, the internal volume of the cavity 431 is expanded, and thus the ink is drawn in from the reservoir 441, whereas with downward warping, the internal volume of the cavity 431 is reduced, and thus the ink is discharged from the nozzle 451.

The piezoelectric element 40 is not limited to being the unimorph type, however, and need only be a type, such as a bimorph type or laminated type, with which the piezoelectric element can be deformed to discharge a liquid such as ink.

Figure 3:
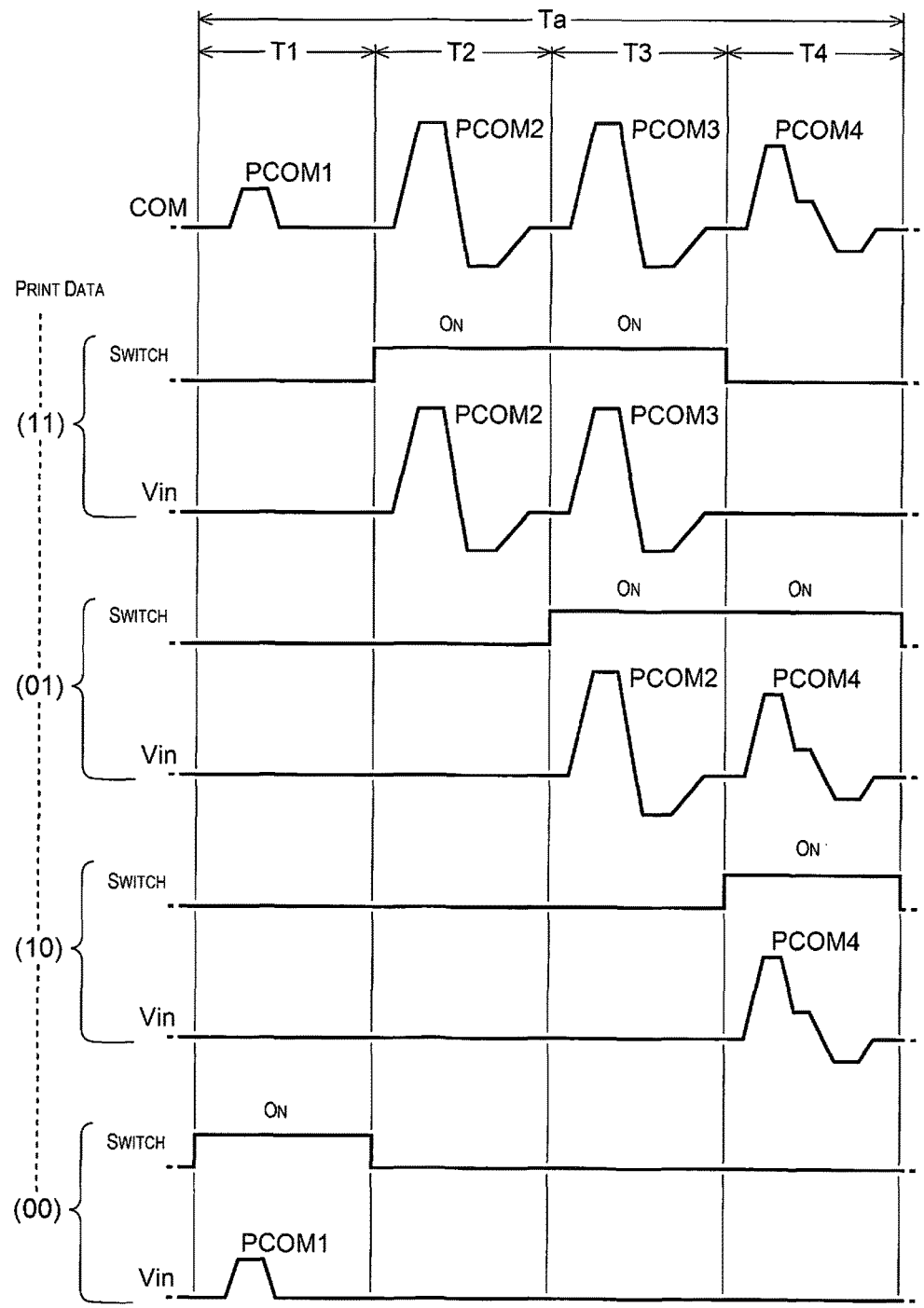
FIG. 3 is a waveform diagram illustrating one example of, inter alia, a control signal COM supplied to a print head.

FIG. 3 is a drawing illustrating one example of, inter alia, the control signal COM supplied to the print head 20.

As is illustrated in FIG. 3, in the control signal COM, drive pulses from PCOM1 to PCOM4, which are the smallest unit of the signal for driving the piezoelectric element 40, are continuous in time series during a print cycle Ta. The control signal COM is, in fact, a repetitive waveform for which the print cycle Ta represents one cycle.

In the print duration Ta, the drive pulse PCOM1 is positioned at an initial first duration T1, the drive pulse PCOM2 is positioned at a subsequent second duration T2, the drive pulse PCOM3 is positioned at a third duration T3, and the drive pulse PCOM4 is positioned at a fourth duration T4.

In the present embodiment, the drive pulses PCOM2 and PCOM3 are waveforms that are substantially identical to one another and are waveforms that, when provisionally understood to each be supplied to a piezoelectric element 40, cause a predetermined amount, e.g., a moderate amount of ink to be respectively discharged from the nozzles. The drive pulse PCOM4 takes a waveform that is different from the drive pulse PCOM2 (PCOM3), and is a waveform that, when the drive pulse PCOM4 is provisionally understood to be supplied to a piezoelectric element 40, causes an amount of ink lesser than the predetermined amount to be discharged from the nozzle. The drive pulse PCOM1, however, is a waveform for minutely vibrating the ink near the opening of the nozzle and preventing an increase in the viscosity of the ink. For this reason, even were the drive pulse PCOM1 to be supplied to the piezoelectric element 40, ink droplets would not be discharged from the nozzle.

In turn, the variety of signals supplied from the main control section 120 supply two-bit print data with which the amount of ink (gradation) to be discharged from the nozzles is defined for every pixel, pulses for defining the start timing of the print cycle Ta, pulses for defining the start time of the durations T2, T3, T4, and the like.

The head control section 220 selects the control signals COM in the following manner for every driver 30, in conformity with the variety of signals supplied from the main control section 120, and supplies the selected control signals COM as the control signals Vin.

FIG. 3 also illustrates how, with respect to the two-bit print data, the control signals COM are selected by the head control section 220 and the selection section 230, and supplied as the control signals Vin.

More specifically, when print data corresponding to a given nozzle is, for example, (11), then the head control section 220 turns the switch 232 corresponding to the relevant nozzle on during the durations T2, T3. For this reason, out of the control signals COM, the drive pulses PCOM2, PCOM3 are selected and serve as the control signals Vin. As shall be described below, the driver 30 outputs a voltage Vout so as to track the voltages of the control signals Vin, and drive the piezoelectric element 40 corresponding to the relevant nozzle. For this reason, moderate amounts of ink corresponding respectively thereto are discharged in two rounds from the relevant nozzle. As such, the ink lands and merges together on the recording medium, as a result of which a large-sized dot is formed.

When the print data corresponding to a given nozzle is (01), then the head control section 220 turns the switch 232 corresponding to the relevant nozzle on during the durations T3, T4. For this reason, out of the control signals COM, the drive pulses PCOM3, PCOM4 are selected and serve as the control signals Vin. Because the piezoelectric element 40 is driven by the voltage Vout tracking the control signals Vin, a moderate and small amount of ink are discharged in two rounds in respective correspondence thereto from the relevant nozzle. As such, the ink lands and merges together on the recording medium, as a result of which a medium-sized dot is formed.

In turn, when the print data corresponding to a given nozzle is (10), then the head control section 220 turns the switch 232 corresponding to the relevant nozzle on only during the duration T4. For this reason, out of the control signals COM, the drive pulse PCOM4 is selected and serves as the control signals Vin. Because the piezoelectric element 40 is driven by the voltage Vout tracking the control signals Vin, a small amount of ink is discharged in one round from the relevant nozzle. As such, a small-sized dot is formed on the recording medium.

When the print data corresponding to a given nozzle is (00), then the head control section 220 turns the switch 232 corresponding to the relevant nozzle on during only the duration T1. For this reason, out of the control signals COM, the drive pulse PCOM1 is selected and serves as the control signals Vin. The piezoelectric element 40 is driven by the voltage Vout tracking the control signals Vin, but it is only that the ink near the opening of the nozzle is minutely vibrated during the duration T1. As such, no ink is discharged, and therefore no dot is formed on the recording medium, i.e., the state is one of non-recording.

Selecting the control signals COM and supplying same as the control signals Vin in accordance with such print data causes four gradations—large-sized dots, medium-sized dots, small-sized dots, and non-recording—to be represented. The selection operation of such description is executed simultaneously and in parallel for every nozzle. The waveforms and the like illustrated in FIG. 3 are merely provided by way of example.

Figure 4:
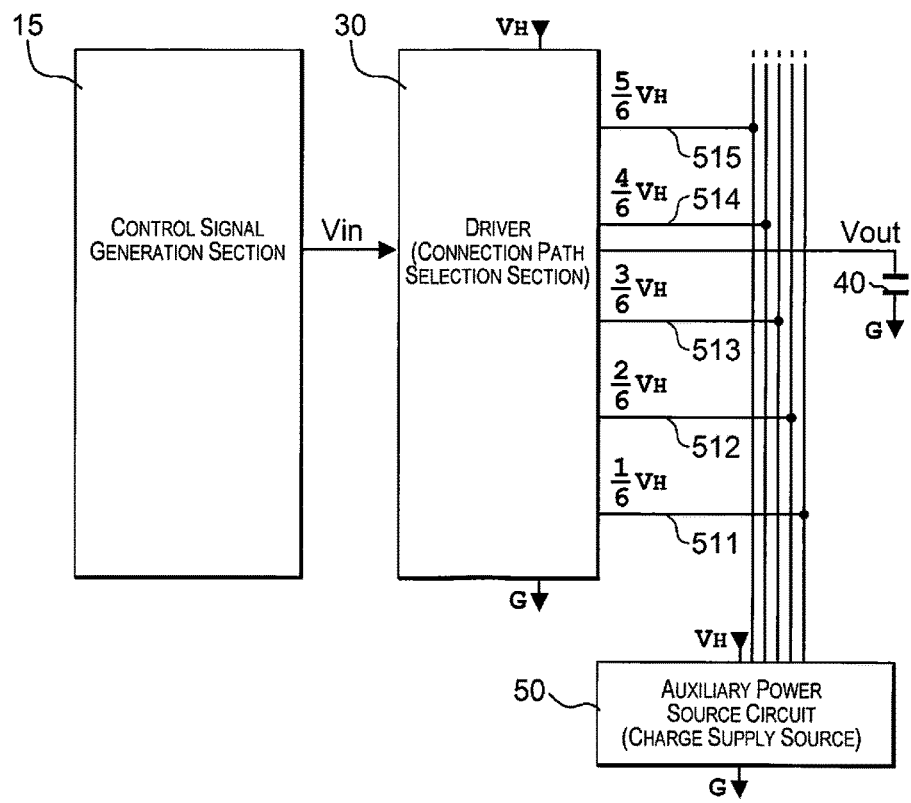
FIG. 4 is a block diagram illustrating the principal configuration of a print apparatus.

FIG. 4 is a block diagram illustrating the principal configuration of when the focus is on one set of a driver 30 and piezoelectric element 40 in the print apparatus 1.

The control signals Vin supplied to the driver 30 are signals obtained when the drive signals COM, having been converted out by the DAC 160, are extracted out by turning on the switch 232 that corresponds to the relevant driver 30. For this reason, the control signals Vin could be said to be supplied to the relevant driver 30 from a control signal generation section 15, one block of which would be the main control section 120, the DAC 160, and the selection section 230 (switch 232), which are a previous stage of the driver 30.

In turn, the auxiliary power source circuit 50 generates the voltages $V_H/6$, $2V_H/6$, $3V_H/6$, $4V_H/6$, and $5V_H/6$ from the power source voltages $V_H$, G and supplies same to the driver 30, and the driver 30 uses the power source voltages $V_H$, G and the voltages $V_H/6$, $2V_H/6$, $3V_H/6$, $4V_H/6$, $5V_H/6$ to supply the voltages Vout tracking the voltages of the control signals Vin to the piezoelectric element 40, as has been described above. The voltage $V_H/6$ is supplied to the driver 30 from the auxiliary power source circuit 50 via a power source wiring 511 and, similarly, the voltages $2V_H/6$, $3V_H/6$, $4V_H/6$, $5V_H/6$ are supplied via power source wirings 512, 513, 514, 515. As is noted by the parentheses in FIG. 4, the auxiliary power source circuit 50 is equivalent to a charge supply source, and the driver 30 is equivalent to a connection path selection section. The power source wirings 511, 512, and so forth are then equivalent to a first signal path, second signal path, and so forth, where the voltages $V_H/6$, $2V_H/6$, and so forth are a first voltage, a second voltage, and so forth.

Driver

The piezoelectric elements 40 are provided so as to correspond to each of the plurality of nozzles in the print head 20, and are driven by the drivers 30 with which each is respectively paired.

Figure 5:
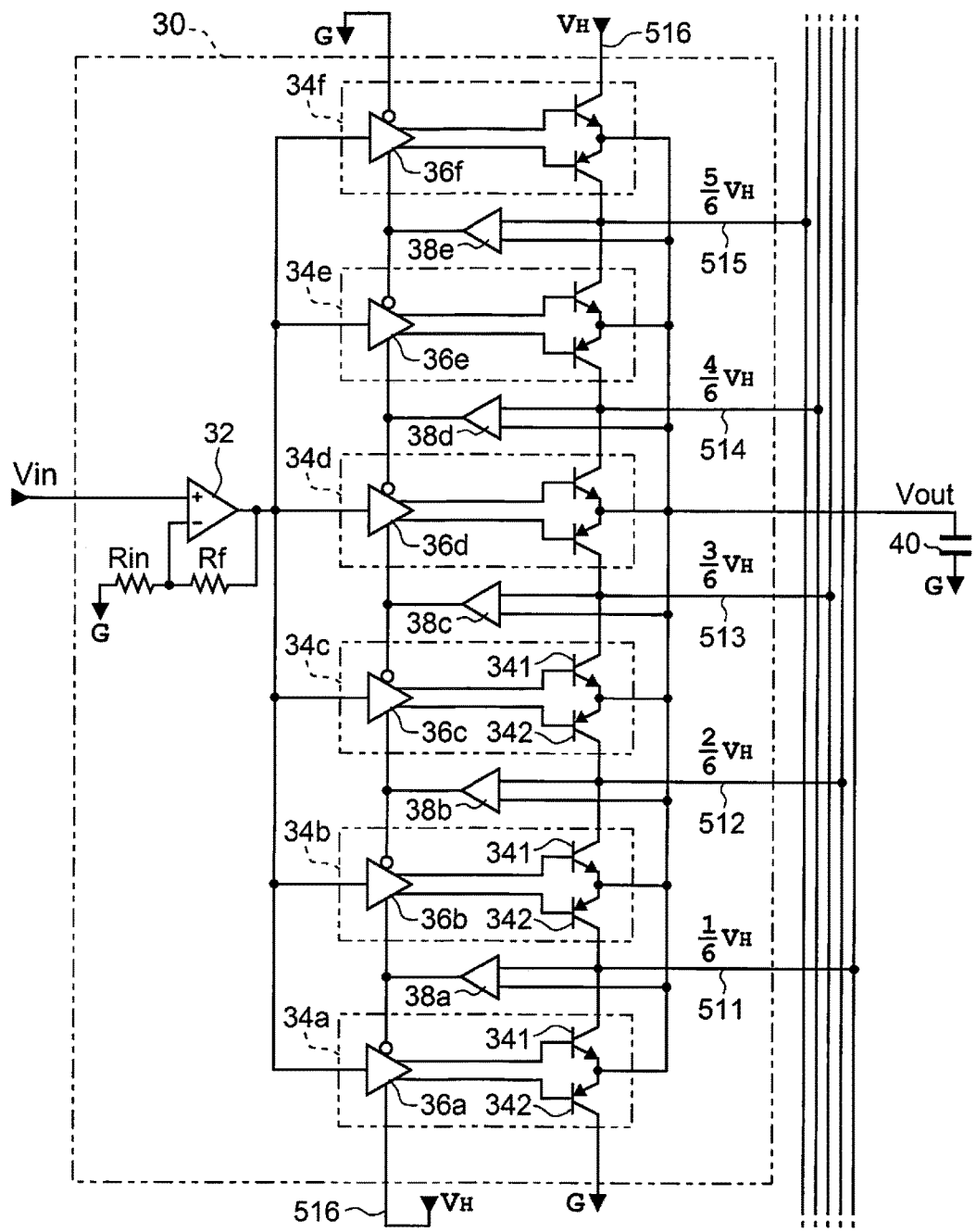
FIG. 5 is a drawing illustrating one example of the configuration of a driver in a print head.

FIG. 5 is a drawing illustrating one example of the configuration of a driver 30 for driving one piezoelectric element 40.

As is illustrated in FIG. 5, the driver 30 comprises an operational amplifier 32, unit circuits 34a to 34f, and comparators 38a to 38e, and has a configuration for driving the piezoelectric element 40 in conformity with the control signals Vin.

When voltage zero is included, the driver 30 uses seven types of voltages, which, when stated in ascending order, namely are voltage zero (ground G) and $V_H/6$, $2V_H/6$, $3V_H/6$, $4V_H/6$, $5V_H/6$, and $V_H$.

Of these, five types of voltages, excluding voltage zero and the voltage $V_H$, are supplied from the auxiliary power source circuit 50 via the power source wirings 511, 512, 513, 514, 515, respectively.

The control signals Vin, which are outputted from the selection section 230, are supplied to an input end (+) of the operational amplifier 32, which is an input end of the driver 30. Output signals of the operational amplifier 32 are supplied to the unit circuits 34a to 34f, negatively fed back to an input end (−) of the operational amplifier 32 via a resistor Rf, and also grounded to the ground G via a resistor Rin. For this reason, the operational amplifier 32 non-invertingly amplifies the control signals Vin by a factor of (1+Rf/Rin).

The voltage amplification factor of the operational amplifier 32 can be set by the resistors Rf, Rin, but for the sake of convenience, Rf is understood to be zero and Rin is understood to be infinite below. That is to say, the following description understands the voltage amplification factor of the operational amplifier 32 to have been set to "1" and understands the control signals Vin to be supplied to the unit circuits 34a to 34f without alteration. The voltage amplification factor may be a number other than "1".

The unit circuits 34a to 34f are provided in ascending order of voltage so as to correspond to two mutually adjacent voltages out of the aforementioned types of voltages. More specifically, the unit circuit 34a is provided so as to correspond to voltage zero and the voltage $V_H/6$, the unit circuit 34b is provided so as to correspond to the voltage $V_H/6$ and the voltage $2V_H 6$, the unit circuit 34c is provided so as to correspond to the voltage $2V_H/6$ and the voltage $3V_H/6$, the unit circuit 34d is provided so as to correspond to the voltage $3V_H/6$ and the voltage $4V_H/6$, the unit circuit 34e is provided so as to correspond to the voltage $4V_H/6$ and the voltage $5V_H/6$, and the unit circuit 34f is provided so as to correspond to the voltage $5V_H/6$ and the voltage $V_H$.

The circuitry configurations of the unit circuits 34a to 34f are mutually identical, and comprise whichever one respectively corresponds out of level shifters 36a to 36f, a bipolar NPN transistor 341, and a PNP transistor 342.

Where the unit circuits 34a to 34f are described in general rather than specific terms, then the description shall simply relate to a reference numeral "34"; likewise, where the level shifters 36a to 36f are described in general rather than specific terms, then the description shall simply relate to a reference numeral "36".

The level shifters 36 take either an enable state or a disable state. More specifically, the level shifters 36 are in the enable state when the signal supplied to a negative control end, marked with a circle, is an L level and the signal supplied to a positive control end, not marked with a circle, is an H level; at all other times, the level shifters 36 are in the disable state.

As will be described below, out of the aforementioned seven types of voltages, each of the comparators 38a to 38e is associated by pairs with five types of voltages, excluding voltage zero and the voltage $V_H$. Focusing herein on a given unit circuit 34, the output signal of the comparator associated with a high-side voltage out of the two voltages associated with the relevant unit circuit 34 is supplied to the negative control end of the level shifter 36 in the relevant unit circuit 34, and the output signal of the comparator associated with a low-side voltage out of the two voltages associated with the relevant unit circuit is supplied to the positive control end of the level shifter 36. The negative control end of the level shifter 36f in the unit circuit 34f is grounded to the ground G of voltage zero, equivalent to the L level, and the positive control end of the level shifter 36a in the unit circuit 34a is connected to the power source wiring 516, which supplies the voltage $V_H$, equivalent to the H level.

The level shifters 36, when in the enable state, shift the voltage of the inputted control signals Vin by a predetermined value in a minus direction and supply the shifted voltage to a base terminal of the transistors 341, and in turn shift the voltage of the control signals Vin by a predetermined value in a plus direction and supply the shifted voltage to a base terminal of the transistor 342. Irrespective of the control signals Vin, the level shifters 36 when in the disable state supply a voltage for turning the transistors 341 off, e.g., the voltage $V_H$ to the base terminals of the relevant transistors 341, and supply a voltage for turning the transistors 342 off, e.g., voltage zero to the base terminals of the relevant transistors 342.

The predetermined value is understood to be a voltage (bias voltage, about 0.6 V) between a base and emitter, at which a current begins to flow to an emitter terminal. For this reason, the predetermined value is a quality determined in accordance with the properties of the transistors 341, 342, and is zero provided that the transistors 341, 342 are ideal.

A collector terminal of the transistor 341 is connected to the power source wiring that supplies the high-side voltage out of the two corresponding voltages, and a collector terminal of the transistor 342 is connected to the power source wiring that supplies the low-side voltage. In, for example, the unit circuit 34a, which corresponds to voltage zero and the voltage $V_H/6$, the collector terminal of the transistor 341 is connected to the power source wiring 511, which supplies the voltage $V_H/6$, and the collector terminal of the transistor 342 is grounded to the ground G of voltage zero. In another example, in the unit circuit 34b, which corresponds to the voltage $V_H/6$ and the voltage $2V_H/6$, the collector terminal of the transistor 341 is connected to the power source wiring 512, which supplies the voltage $2V_H/6$, and the collector terminal of the transistor 342 is connected to the power source wiring 511, which supplies the voltage $V_H/6$. In the unit circuit 34f, which corresponds to the voltage $5V_H/6$ and the voltage $V_H$, the collector terminal of the transistor 341 is connected to the power source wiring 516, which supplies the voltage $V_H$, and the collector terminal of the transistor 342 is connected to the power source wiring 515, which supplies the voltage $5V_H/6$.

In turn, in the unit circuits 34a to 34f, emitter terminals of the transistors 341, 342 share a connection to one end of the piezoelectric element 40. For this reason, the common connection point of the emitter terminals of the transistors 341, 342 is connected to the one end of the piezoelectric element 40 as an output end of the driver 30.

Out of the aforementioned seven types of voltages, the comparators 38a to 38e correspond to five types of voltages $V_H/6$, $2V_H/6$, $3V_H/6$, $4V_H/6$, $5V_H/6$, $V_H$, excluding voltage zero and the voltage $V_H$, and compare the relative levels of voltages supplied to the two input ends and output a signal indicative of the comparison result. Herein, out of the two input ends in the comparators 38a to 38e, one end is connected to the power source wiring that supplies the voltage that corresponds thereto, and the other end shares a connection to the one end of the piezoelectric element 40, along with each of the emitter terminals of the transistors 341, 342. For example, in the comparator 38a, which corresponds to the voltage $V_H/6$, one end out of the two input ends is connected to the power source wiring 511, which supplies the voltage $V_H/6$ corresponding thereto; in another example, in the comparator 38b, which corresponds to the voltage $2V_H/6$, one end of the two input ends is connected to the power source wiring 512, which supplies the voltage $2V_H/6$ corresponding thereto.

Each of the comparators 38a to 38e outputs a signal which takes the H level when the voltage Vout of the other end at the input end is not less than the voltage of the one end, and takes the L level when the voltage Vout is less than the voltage of the one end.

More specifically, for example, the comparator 38a outputs a signal which takes the H level when the voltage Vout is not less than the voltage $V_H/6$, and takes the L level when the voltage Vout is less than the voltage $V_H/6$. As another example, the comparator 38b outputs a signal which takes the H level when the voltage Vout is not less than the voltage $2V_H/6$, and takes the L level when the voltage Vout is less than the voltage $2V_H/6$.

To focus now on one out of the five types of voltages, the output signal of the comparator corresponding to the relevant voltage of interest is supplied to both the negative input end of the level shifter 36 of the unit circuit for which the relevant voltage is the high-side voltage, and the positive input end of the level shifter 36 of the unit circuit for which the relevant voltage is the low-side voltage.

For example, the output signal of the comparator 38a, which corresponds to the voltage $V_H/6$, is supplied to the negative input end of the level shifter 36a of the unit circuit 34a, for which the relevant voltage $V_H/6$ is associated as the high-sigh voltage, and to the positive input end of the level shifter 36b of the unit circuit 34b, for which the relevant voltage $V_H/6$ is associated as the low-side voltage. As another example, the output signal of the comparator 38b, which corresponds to the voltage $2V_H/6$, is supplied to the negative input end of the level shifter 36b of the unit circuit 34b, for which the relevant voltage $2V_H/6$ is associated as the high-sigh voltage, and to the positive input end of the level shifter 36c of the unit circuit 34c, for which the relevant voltage $2V_H/6$ is associated as the low-side voltage.

Next, the operation of the driver 30 shall now be described.

First, the states reached by the comparators 38a to 38e and the level shifters 36 with respect to the voltage Vout, held by the piezoelectric element 40, shall be described.

In a state (first state) where the voltage Vout is between voltage zero and less than the voltage $V_H/6$, then the output signals of the comparators 38a to 38e are all at the L level. For this reason, in the first state, only the level shifter 36a is in the enable state, and the other level shifters 36b to 36f are in the disable state.

In a state (second state) where the voltage Vout is not less than the voltage $V_H/6$ but is less than the voltage $2V_H/6$, then the output signal of the comparator 38a is at the H level, and the output signals of the other comparators 38b to 38e are at the L level. For this reason, in the second state, only the level shifter 36b is in the enable state, and the other level shifters 36a, 36c to 36f are in the disable state.

In a state (third state) where the voltage Vout is not less than the voltage $2V_H/6$ but is less than the voltage $3V_H/6$, then the output signals of the comparators 38a, 38b are at the H level, and the output signals of the other comparators 38c to 38e are at the L level. For this reason, in the third state, only the level shifter 36c is in the enable state, and the other level shifters 36a, 36b, 36d to 36f are in the disable state.

In a state (fourth state) where the voltage Vout is not less than the voltage $3V_H/6$ but is less than the voltage $4V_H/6$, then the output signals of the comparators 38a, 38b, 38c are at the H level, and the output signals of the other comparators 38d to 38e are at the L level. For this reason, in the fourth state, only the level shifter 36d is in the enable state, and the other level shifters 36a to 36c, 36e, 36f are in the disable state.

In a state (fifth state) where the voltage Vout is not less than the voltage $4V_H/6$ but is less than the voltage $5V_H/6$, then the output signals of the comparators 38a to 38d are at the H level, and the output signal of the other comparator 38e is at the L level. For this reason, in the fifth state, only the level shifter 36e is in the enable state, and the other level shifters 36a to 36d, 36f are in the disable state.

In a state (sixth state) where the voltage Vout is not less than the voltage $5V_H/6$ but is less than the voltage $V_H$, then the output signals of the comparators 38a to 38e are all at the H level. For this reason, in the sixth state, only the level shifter 36f is in the enable state, and the other level shifters 36a to 36d are in the disable state.

Thus, in the first state, only the level shifter 36a is in the enable state. This continues in a similar manner, where only the level shifter 36b is in the enable state in the second state, only the level shifter 36c is in the enable state in the third state, only the level shifter 36d is in the enable state in the fourth state, only the level shifter 36e is in the enable state in the fifth state, and only the level shifter 36f is in the enable state in the sixth state.

The first state through sixth state have been defined with the voltage Vout, but this could also be stated in terms of the state of charge held (stored) in the piezoelectric element 40.

When the level shifter 36a is in the enable state in the first state, then the relevant level shifter 36a supplies a voltage signal obtained when the control signal Vin has been level-shifted by a predetermined value in the minus direction to the base terminal of the transistor 341 in the unit circuit 34a, and supplies a voltage signal obtained when the control signal Vin has been level-shifted by a predetermined value in the plus direction to the base terminal of the transistor 342 in the relevant unit circuit 34a.

Herein, when the voltage of the control signal Vin is higher than the voltage Vout (connection point voltage between the emitter terminals), then a current corresponding to the difference thereof (the voltage between base and emitter; in a stricter sense, a voltage reduced by a predetermined value from the voltage between base and emitter) flows to the emitter terminal from the collector terminal of the transistor 341. For this reason, the voltage Vout gradually rises and approaches the voltage of the control signal Vin, and when the voltage Vout eventually matches the voltage of the control signal Vin, then the current flowing to the transistor 341 at this point in time is zero.

In turn, when the voltage of the control signal Vin is less than the voltage Vout, then a current corresponding to the difference flows to the collector terminal from the emitter terminal of the transistor 342. For this reason, the voltage Vout gradually lowers and approaches the voltage of the control signal Vin, and when the voltage Vout eventually matches the voltage of the control signal Vin, then the current flowing to the transistor 342 at this point in time is zero.

As such, in the first state, the transistors 341, 342 of the unit circuit 34a will execute such a control as to match the voltage Vout to the control signal Vin.

In the first state, because the level shifters 36 are in the disable state in the unit circuits 34b to 34f other than the unit circuit 34a, the voltage $V_H$ is supplied to the base terminals of the transistors 341, and voltage zero is supplied to the base terminals of the transistors 342. For this reason, in the first state, the transistors 341, 341 are off in the unit circuits 34b to 34f, and therefore are not involved in the control of the voltage Vout.

The description herein is of when the first state is in effect, but the operation will be similar in the second state through sixth state, as well. More specifically, one of the unit circuits 34a to 34f is enabled, depending on the voltage Vout held by the piezoelectric element 40, and the transistors 341, 342 of the enabled unit circuit implement a control so as to match the voltage Vout to the control signal Vin. For this reason, when the driver 30 is viewed as a whole, the operation is one where the voltage Vout tracks the voltage of the control signal Vin.

Figure 6A:
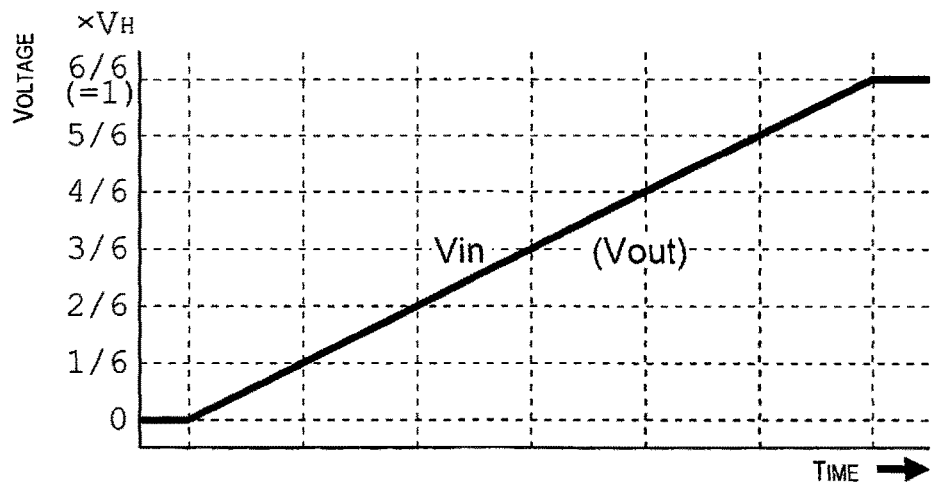
FIGS. 6A and 6B are diagrams for describing the operation of a driver.
Figure 6B:
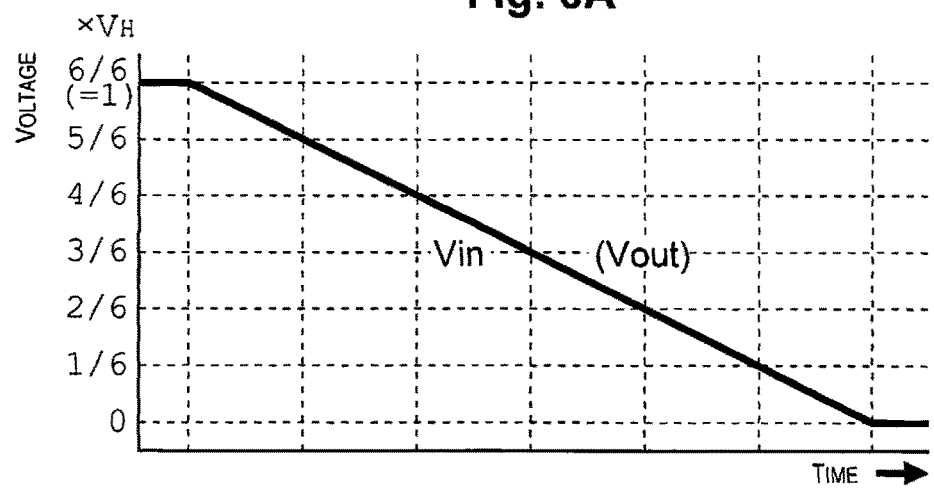

As such, as illustrated in FIG. 6A, when the control signal Vin rises, for example, from voltage zero to the voltage $V_H$, then the voltage Vout also tracks the control signal Vin and changes from voltage zero to the voltage $V_H$. As illustrated in FIG. 6B, when the control signal Vin lowers from the voltage $V_H$ to voltage zero, then the voltage Vout also tracks the control signal Vin and changes from the voltage $V_H$ to voltage zero.

Figure 7A:
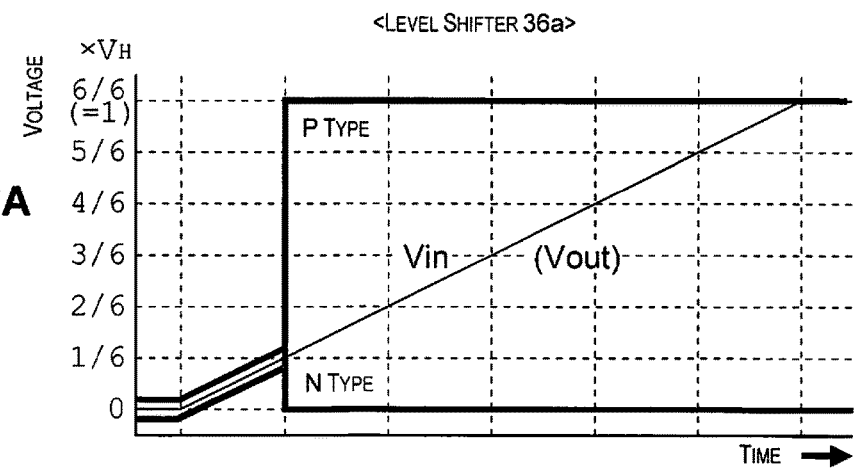
FIGS. 7A to 7C are drawings for describing the operation of a level shifter in a driver.
Figure 7B:
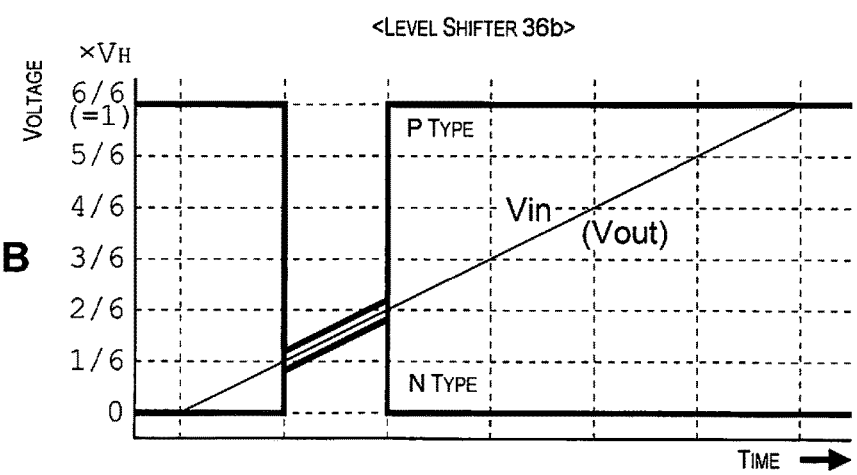
Figure 7C:
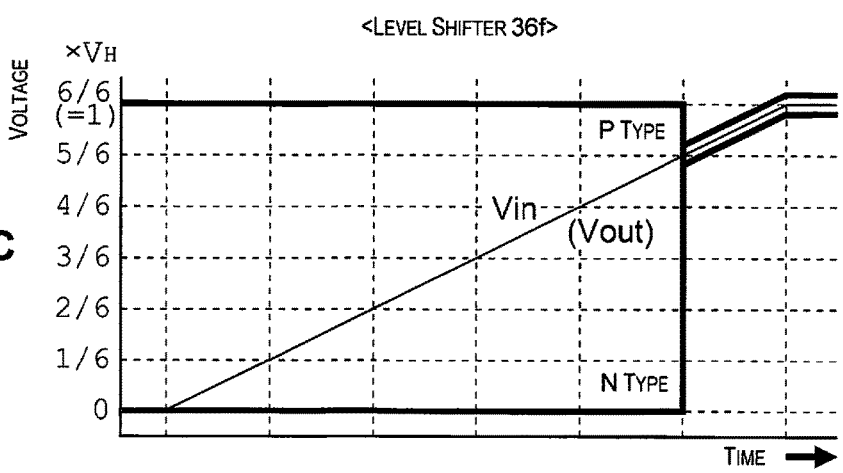

FIGS. 7A to 7C are drawings for describing the operation of the level shifters.

When the voltage of the control signal Vin changes, rising from voltage zero to the voltage $V_H$, the voltage Vout also tracks the control signal Vin and rises. In the course of this rise, the level shifter 36a is in the enable state when the first state, where the voltage Vout is between voltage zero and less than the voltage $V_H/6$, is in effect. For this reason, as illustrated in FIG. 7A, the voltage (denoted by "P-type") that is supplied to the base terminal of the transistor 341 by the level shifter 36a is a voltage obtained when the control signal Vin has been shifted by a predetermined value in the minus direction, and the voltage (denoted by "N-type") that is supplied to the base terminal of the transistor 342 is a voltage obtained when the control signal Vin has been shifted by a predetermined value in the plus direction. When a state other than the first state is in effect, however, then the level shifter 36a is in the disable state, and therefore the voltage that is supplied to the base terminal of the transistor 341 is $V_H$, and the voltage that is supplied to the base terminal of the transistor 342 is zero.

FIG. 7B illustrates a voltage waveform outputted by the level shifter 36b, and FIG. 7C illustrates a voltage waveform outputted by the level shifter 36f. No special description shall be needed provided that one remembers that the level shifter 36b is in the enable state when the second state, where the voltage Vout is between the voltage $1V_H/6$ and less than the voltage $2V_H/6$, is in effect, and that the level shifter 36f is in the enable state when the sixth state, where the voltage Vout is between the voltage $5V_H/6$ and less than the voltage $V_H$, is in effect.

The description shall also forgo describing the operation of the level shifters 36c to 36e in the course of rising of the voltage of the control signal Vin (or the voltage Vout), and describing the operation of the level shifters 36a to 36f in the course of lowering of the voltage of the control signal Vin (or the voltage Vout).

Next, the flow of current (charge) in the unit circuits 34a to 34f shall be described, taking the unit circuits 34a, 34b by way of example, and divided between during charging and during discharging.

Figure 8:
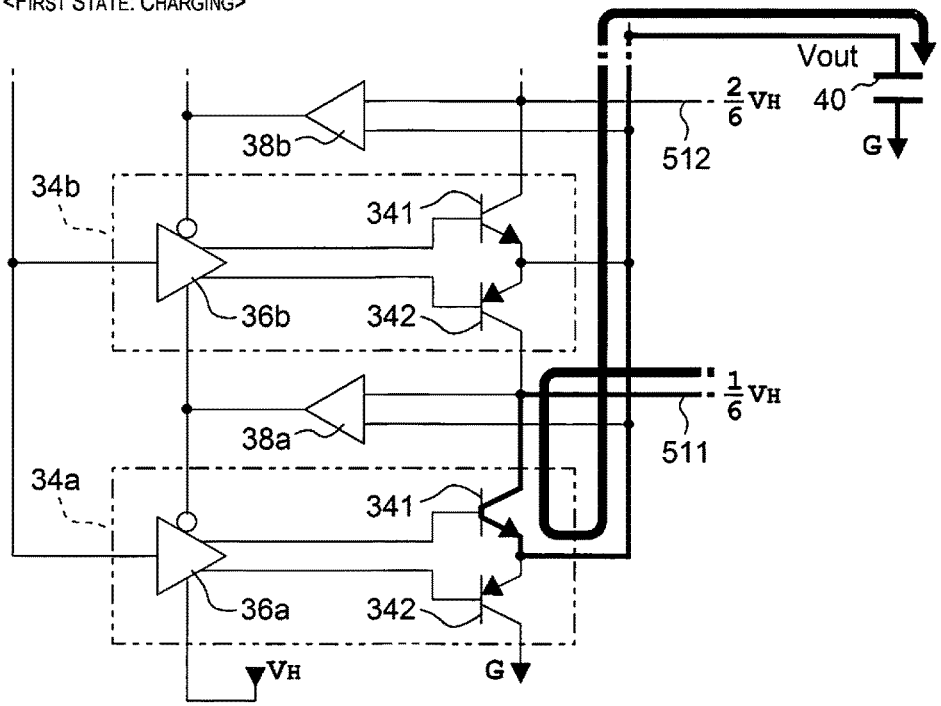
FIG. 8 is a drawing for describing the flow of an electrical current (charge) in a driver.

FIG. 8 is a drawing illustrating the operation of when the piezoelectric element 40 is charged when the first state (a state where the voltage Vout is between voltage zero and less than the voltage $V_H/6$) is in effect.

In the first state, the level shifter 36a is in the enable state and the other level shifters 36b to 36f are in the disable state, and therefore it suffices to focus only on the unit circuit 34a.

When the voltage of the control signal Vin is higher than the voltage Vout in the first state, then a current corresponding to the voltage between base and emitter flows through the transistor 341 of the unit circuit 34a. As such, the transistor 341 of the unit circuit 34a will function as a first transistor. At this time, the transistor 342 of the unit circuit 34a is off.

At this time, the electrical current flows in a path that goes from the power source wiring 511→the transistor 341 (of the unit circuit 34a)→the piezoelectric element 40, as illustrated by the arrow in FIG. 8, thus charging the piezoelectric element 40 with a charge. This charging causes the voltage Vout to rise.

When the voltage Vout matches the voltage of the control signal Vin, the transistor 341 of the unit circuit 34a is off, and therefore the charging of the piezoelectric element 40 is stopped.

However, in a case where the control signal Vin rises to the voltage $V_H/6$ or higher, then the voltage Vout also tracks the control signal Vin and therefore reaches the voltage $V_H/6$ or higher as well, and a transition is made from the first state to the second state (a state where the voltage Vout is between the voltage $1V_H/6$ and less than the voltage $2V_H/6$).

Figure 9:
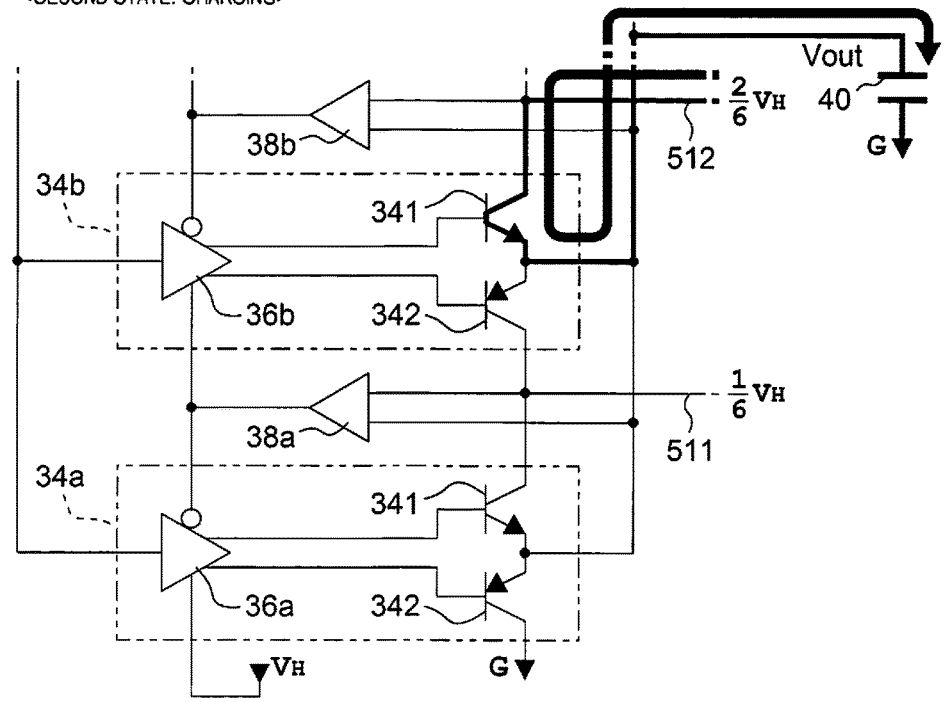
FIG. 9 is a drawing for describing the flow of an electrical current (charge) in a driver.

FIG. 9 is a drawing illustrating the operation of when the piezoelectric element 40 is charged in the second state.

In the second state, the level shifter 36b is in the enable state and the other level shifters 36a, 36c to 36f are in the disable state, and therefore it suffices to focus only on the unit circuit 34b.

When the voltage of the control signal Vin is higher than the voltage Vout in the second state, then a current corresponding to the voltage between base and emitter flows through the transistor 341 of the unit circuit 34b. As such, the transistor 341 of the unit circuit 34b will function as a third transistor. At this time, the transistor 342 of the unit circuit 34b is off.

At this time, the electrical current flows in a path that goes from the power source wiring 512→the transistor 341 (of the unit circuit 34b)→the piezoelectric element 40, as illustrated by the arrow in FIG. 9, thus charging the piezoelectric element 40 with a charge. That is to say, in a case where the piezoelectric element 40 is charged in the second state, one end of the piezoelectric element 40 is electrically connected to the auxiliary power source circuit 50 via the power source wiring 512.

Thus, when a transition is made from the first state to the second state during rising of the voltage Vout, then the source of supply of the electric current is switched from the power source wiring 511 to the power source wiring 512.

When the voltage Vout matches the voltage of the control signal Vin, the transistor 341 of the unit circuit 34b is off, and therefore the charging of the piezoelectric element 40 is stopped.

However, in a case where the control signal Vin rises to the voltage $2V_H/6$ or higher, then the voltage Vout also tracks the control signal Vin and therefore reaches the voltage $2V_H/6$ or higher as well, as a result of which a transition is made from the second state to the third state (a state where the voltage Vout is between the voltage $2V_H/6$ and less than the voltage $3V_H/6$).

In the charging operation from the third state to the sixth state, though not shown, the source of supply of the electrical current is switched in a stepwise manner to the power source wirings 513, 514, 515, 516.

Figure 10:
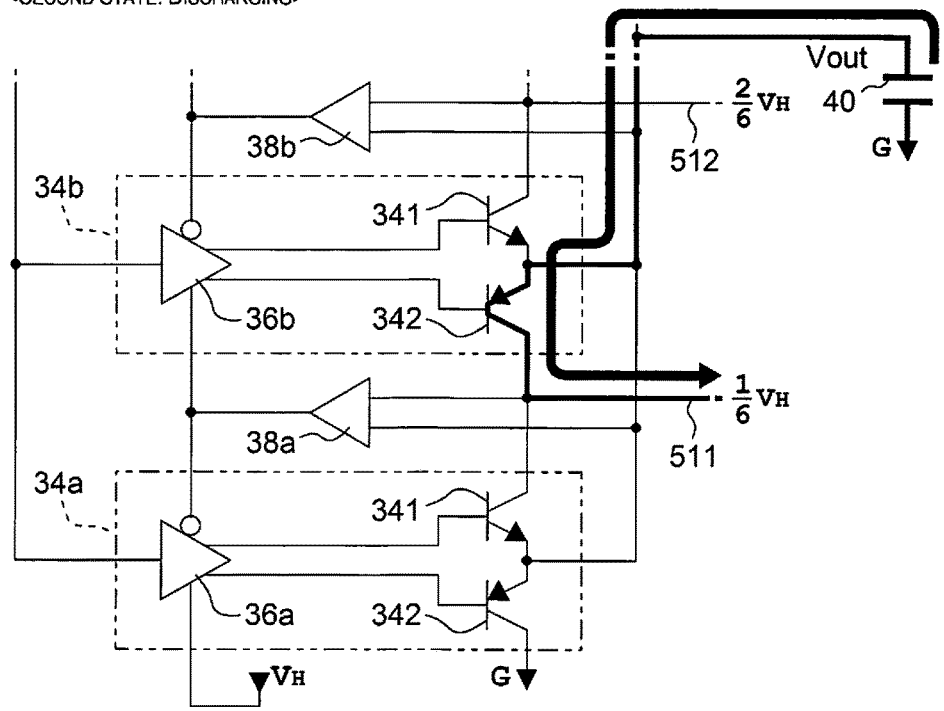
FIG. 10 is a drawing for describing the flow of an electrical current (charge) in a driver.

FIG. 10 is a drawing illustrating the operation of when the piezoelectric element 40 is discharged when the second state is in effect.

In the second state, the level shifter 36b is in the enable state. When the voltage of the control signal Vin is lower than the voltage Vout in this state, then a current corresponding to the voltage between base and emitter flows through the transistor 342 of the unit circuit 34b. As such, the transistor 341 of the unit circuit 34b will function as a second transistor. At this time, the transistor 341 of the unit circuit 34b is off.

At this time, the electrical current flows in a path that goes from the piezoelectric element 40→the transistor 342 (of the unit circuit 34b)→the power source wiring 511, as illustrated by the arrow in FIG. 10, thus discharging the charge from the piezoelectric element 40. That is to say, in a case where the piezoelectric element 40 is charged with a charge in the first state, and in a case where a charge is discharged from the piezoelectric element 40 in the second state, then one end of the piezoelectric element 40 is electrically connected to the auxiliary power source circuit 50 via the power source wiring 511. Further, the power source wiring 511 supplies a current (charge) during charging in the first state, and recovers a current (charge) during discharging of the second state.

The recovered charge is redistributed for reuse by the auxiliary power source circuit 50 (described below).

When the voltage Vout matches the control signal Vin, the transistor 342 of the unit circuit 34b is off and therefore discharging of the piezoelectric element 40 is stopped.

However, in a case where the control signal Vin falls to less than the voltage $V_H/6$, then the voltage Vout also tracks the control signal Vin and therefore reaches less than the voltage $V_H/6$ as well, and a transition is made from the second state to the first state.

Figure 11:
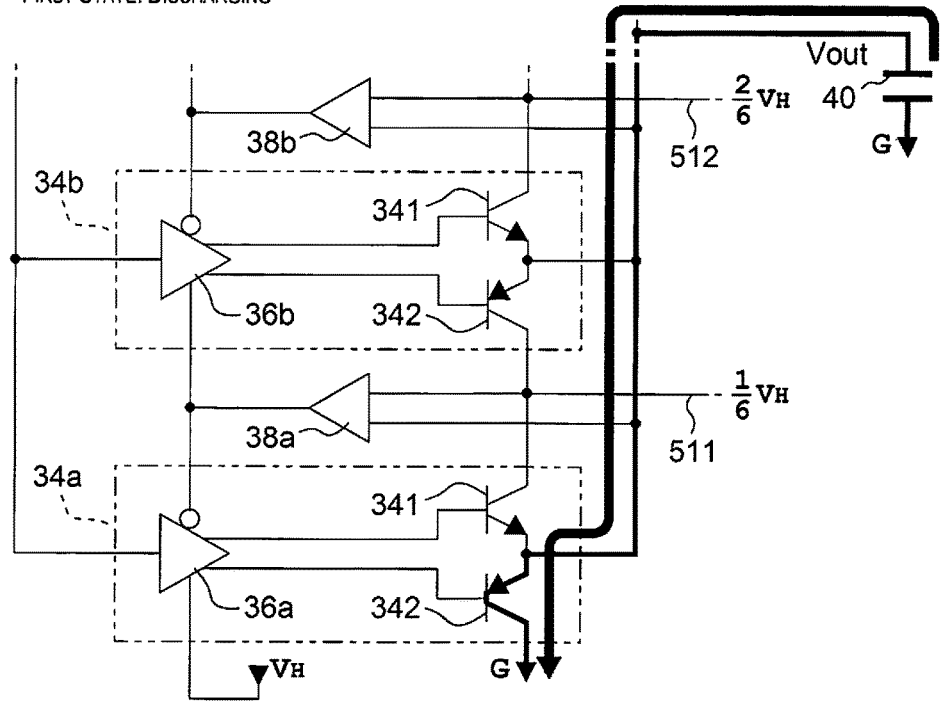
FIG. 11 is a drawing for describing the flow of an electrical current (charge) in a driver.

FIG. 11 is a drawing illustrating the operation of when the piezoelectric element 40 is discharged when the first state is in effect.

In the first state, the level shifter 36a is in the enable state. When the voltage of the control signal Vin is lower than the voltage Vout in this state, then a current corresponding to the voltage between base and emitter flows through the transistor 342 of the unit circuit 34a.

At this time, the transistor 341 of the unit circuit 34a is off.

At this time, the electrical current flows in a path that goes from the piezoelectric element 40→the transistor 342 (of the unit circuit 34a)→the ground G, as illustrated by the arrow in FIG. 11, thus discharging the charge from the piezoelectric element 40.

The description herein is of the unit circuits 34a, 34b by way of example, divided between during charging and during discharging, but the operation is substantially similar for the unit circuits 34c to 34f as well, except for the fact that the transistors 341, 342 controlling the current are different.

That is to say, the power source wiring 512 supplies the current (charge) during charging in the second state, and recovers the current (charge) during discharging in the third state, the power source wiring 513 supplies the current (charge) during charging in the third state, and recovers the current (charge) during discharging in the fourth state, the power source wiring 514 supplies the current (charge) during charging in the fourth state, and recovers the current (charge) during discharging in the fifth state, the power source wiring 515 supplies the current (charge) during charging in the fifth state, and recovers the current (charge) during discharging in the sixth state, and the power source wiring 516 supplies the current (charge) during charging in the sixth state.

The recovered charge is redistributed for reuse by the auxiliary power source circuit 50.

In the charge path and discharge path in each of the state, there is a common path from the one end of the piezoelectric element 40 to the connection points between emitter terminals in the transistors 341, 342.

Typically, the energy P that is stored in a capacitive load is represented by $$P=(C \cdot E2)/2$$

where C is the capacitance of a capacitive load such as the piezoelectric element 40, and E is the voltage amplitude.

The piezoelectric element 40 works by being deformed by the energy P, but the amount of working for discharging the ink is 1% or less in relation to the energy P. As such, the piezoelectric element 40 can be regarded as a simple capacitance. When a capacitance C is charged at a constant power supply, energy equivalent to $(C \cdot E2)/2$ is consumed by the charge circuit. During discharging, too, an equivalent energy is consumed by the discharge circuit.

Advantage of Driver

In the present embodiment, when the piezoelectric element 40 is charged from voltage zero to the voltage $V_H$, then charging takes place through six stages of:
from voltage zero to the voltage $V_H/6$,
from the voltage $V_H/6$ to the voltage $2V_H/6$,
from the voltage $2V_H/6$ to the voltage $3V_H/6$,
from the voltage $3V_H/6$ to the voltage $4V_H/6$,
from the voltage $4V_H/6$ to the voltage $5V_H/6$, and
from the voltage $5V_H/6$ to the voltage $V_H$.

Figure 12A:
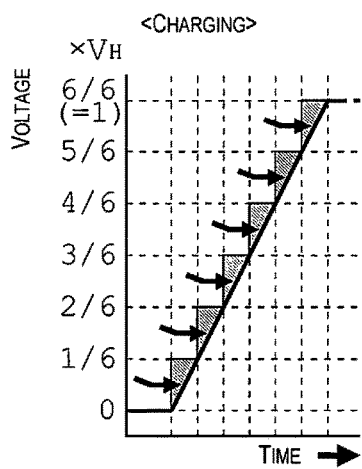
FIGS. 12A and 12B are drawings for describing loss during charging and discharging of a driver.

For this reason, in the present embodiment, the loss during charging is merely an amount corresponding to the surface area of the region that has hatching in FIG. 12A. More specifically, in the present embodiment, the loss during charging in the piezoelectric element 40 is merely 6/36=(16.7%), compared to the linear amplification for charging from voltage zero to the voltage $V_H$ all at once.

Figure 12B:
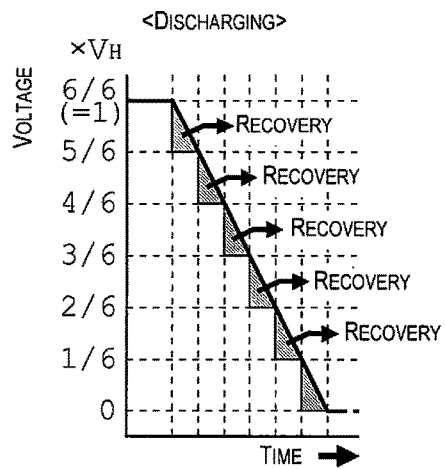

In turn, because discharging is also stepwise in the present embodiment, the loss during discharging is likewise merely 6/36 (=16.7%), compared to the linear format for discharging from the voltage $V_H$ to voltage zero all at once, as illustrated with the amount equivalent to the surface area of the region that has hatching in FIG. 12B.

The present embodiment also enables a further reduction of power consumption because of the redistribution and reuse of charge recovered by the auxiliary power source circuit 50 (described below), excluding cases of discharging from the voltage $V_H/6$ to voltage zero, out of the charge recorded as a loss during discharging.

FIGS. 12A and 12B are merely conceptual diagrams for describing the operation of driving of the piezoelectric element 40 by the driver 30. The piezoelectric element 40 is, in fact, driven by whichever control signal COM is selected out of the drive pulses PCOM1 to PCOM4, and thus driving is not necessarily always performed at an amplitude from voltage zero to the voltage $V_H$.

Class D amplification has a higher energy efficiency compared to linear amplification. This is due in part to the fact that that an active element of an output stage operates at a saturated state and consumes substantially no power, the fact that the exchange of magnetic energy created by an inductor L constituting a low-pass filter and energy created by a capacitance C prevent, during charging, the occurrence of such loss as with linear amplification, and the fact that the electrical current is regenerated to the power source with current switching during discharging.

However, actual class D amplification does have problems, among which the fact that the resistance of the active element of the output stage is not zero, even in the saturated state, the fact that there is leakage of the magnetic field, the fact that the resistance component of the inductor L causes loss to occur, and the fact that in some instances the inductor L is saturated during modulation. In particular in a configuration where, in the print head 20, a selection is made at the selection section 230 from shared control signals COM for supply to a plurality of piezoelectric elements 40, the unsaturated inductors L are increased because there is not a constant total amount of negative charge as seen from the control signals COM.

Class D amplification also has problems in that the waveform quality is poor and EMI countermeasures are necessary. Though waveform quality can be improved by adding a dummy capacitance or filter, the increase entails a commensurate increase in power consumption and rise in costs. EMI derives from the fundamental problem of switching in class D amplification. That is to say, when a switch is made, not only does the current that flows during an on-time reach up to about a factor of several times or several tens of times that of linear amplification, but also the amount of magnetic field emitted in association therewith increases as well. Counteracting EMI requires adding a filter and the like, and entails higher costs.

The drivers 30 of the print apparatus as in the present embodiment do not suffer the problems of poor waveform quality and the need to counteract EMI, because the transistors 341, 342, which are equivalent to an output stage, do not engage in such switching as in class D amplification, and also because inductors L are not used.

Also, the present embodiment involves an operation where the voltage Vout tracks the voltage of the control signals Vin, and therefore the piezoelectric elements 40 can be finely controlled. That is to say, the start voltage and end voltage of the voltage Vout applied to the piezoelectric elements 40 are unrelated to the voltages $V_H/6$, $2V_H/6$, $3V_H/6$, $4V_H/6$, and $5V_H/6$ used for driving.

Auxiliary Power Source Circuit

Figure 13:
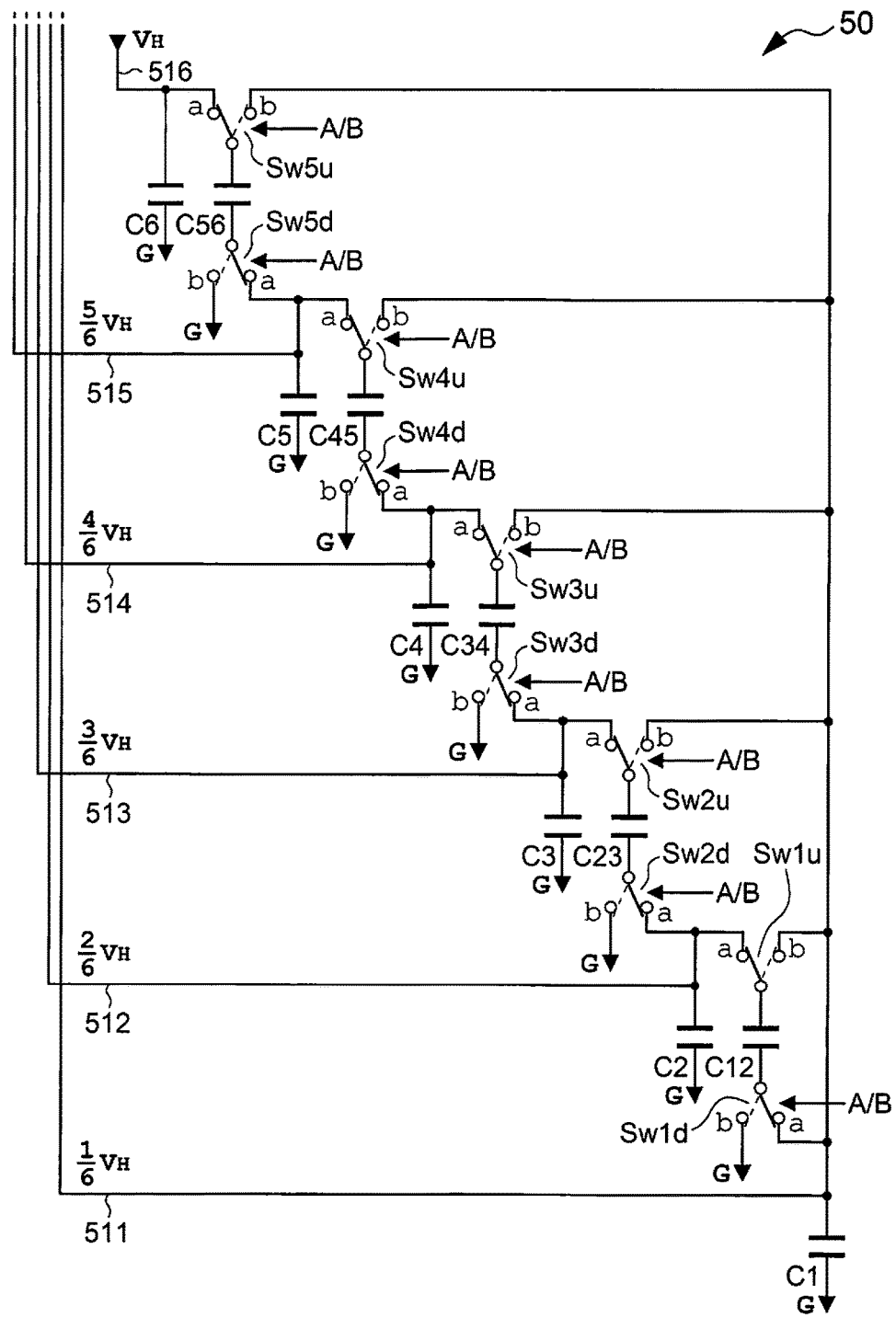
FIG. 13 is a drawing illustrating one example of the configuration of an auxiliary power source circuit.

FIG. 13 is a drawing illustrating one example of the configuration of the auxiliary power source circuit 50.

As illustrated in FIG. 13, the auxiliary power source circuit 50 has a configuration comprising: switches Sw1*d*, Sw1*u*, Sw2*d*, Sw2*u*, Sw3*d*, Sw3*u*, Sw4*d*, Sw4*u*, Sw5*d*, and Sw5*u*; and capacitive elements C12, C23, C34, C45, C56, C1, C2, C3, C4, C5, and C6.

Of these, the switches are all single-pole double-throw, and a shared terminal is connected to a terminal a or b in conformity with control signals A/B. When described in a simplified manner, the control signals A/B are pulse signals for which, for example, the duty ratio is about 50%, and the frequency thereof is set to, for example, a factor of about 20 in relation to the frequency of the control signals COM. The control signals A/B of such description may be generated by an internal oscillator (not shown) in the auxiliary power source circuit 50, and may be supplied to the control unit 10 via the flexible cable 190.

The capacitive elements C12, C23, C34, C45, C56, in turn are for charge transfer, and the capacitive elements C1, C2, C3, C4, C5 are for backup. The capacitive element C6 is for supplying the power source voltage $V_H$.

The switches are in fact configured by combining transistors in a semiconductor integrated circuit, and the capacitive elements are mounted externally with respect to this semiconductor integrated circuit. Preferably, the semiconductor integrated circuit also has the configuration formed with respect to the plurality of drivers 30 described above.

Next, the power source wiring 516 that supplies the voltage $V_H$ in the auxiliary power source circuit 50 is connected to one end of the capacitive element C6 and to a terminal a of the switch Sw5*u*. A shared terminal of the switch Sw5*u* is connected to one end of the capacitive element C56, and the other end of the capacitive element C56 is connected to a shared terminal of the switch Sw5*d*. The terminal a of the switch Sw5*d* is connected to one end of the capacitive element C5 and to the terminal a of the switch Sw4*u*. The shared terminal of the switch Sw4*u* is connected to one end of the capacitive element C45, and the other end of the capacitive element C45 is connected to the shared terminal of the switch Sw4*d*. The terminal a of the switch Sw4*d* is connected to one end of the capacitive element C4 and to the terminal a of the switch Sw3*u*. The shared terminal of the switch Sw3*u* is connected to one end of the capacitive element C34, and the other end of the capacitive element C34 is connected to the shared terminal of the switch Sw3*d*. The terminal a of the switch Sw3*d* is connected to one end of the capacitive element C3 and to the terminal a of the switch Sw2*u*. The shared terminal of the switch Sw2*u* is connected to one end of the capacitive element C23, and the other end of the capacitive element C23 is connected to the shared terminal of the switch Sw2*d*. The terminal a of the switch Sw2*d* is connected to one end of the capacitive element C2 and to the terminal a of the switch Sw1*u*. The shared terminal of the switch Sw1*u* is connected to one end of the capacitive element C12, and the other end of the capacitive element C12 is connected to the shared terminal of the switch Sw1*d*. The terminal a of the switch Sw1*d* is connected to one end of the capacitive element C1.

One end of the capacitive element C5 is connected to the power source wiring 515. Similarly, one end of the capacitive elements C4, C3, C2, C1 is connected to the power source wirings 514, 513, 512, 511, respectively.

Each of the terminals b of the switches Sw5*u*, Sw4*u*, Sw3*u*, Sw2*u*, Sw1*u* is connected to one end of the capacitive element C1 along with the terminal a of the switch Sw1*d*. Each of the other ends of the capacitive elements C6, C5, C4, C3, C2, C1 and each of the terminals b of the switches Sw5d, Sw4d, Sw3d, Sw2d, Sw1d are grounded alike to the ground G.

Figure 14A:
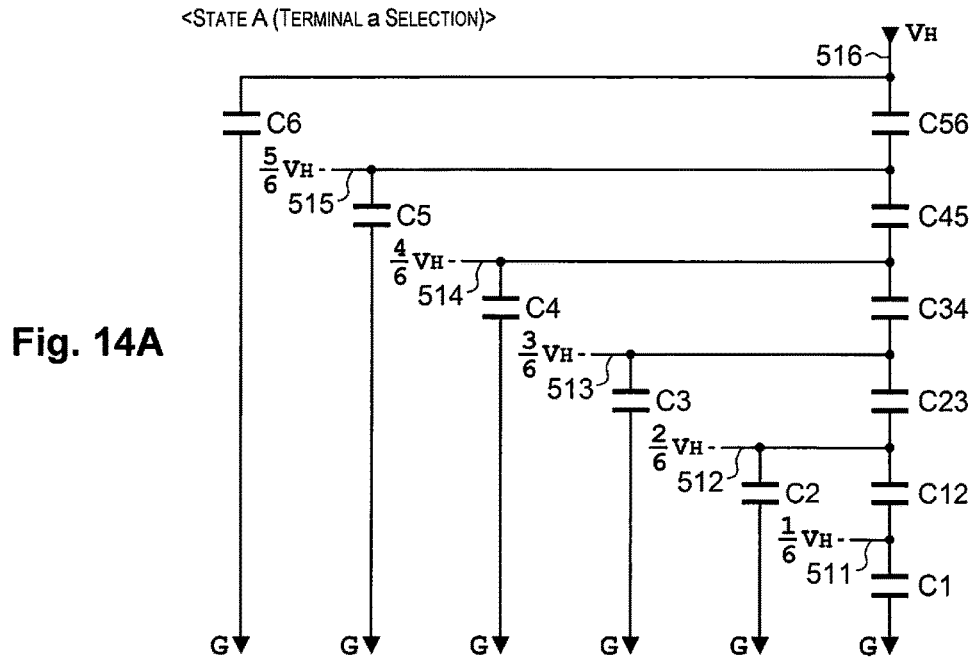
FIGS. 14A and 14B are drawings for describing the operation of an auxiliary power source circuit.
Figure 14B:
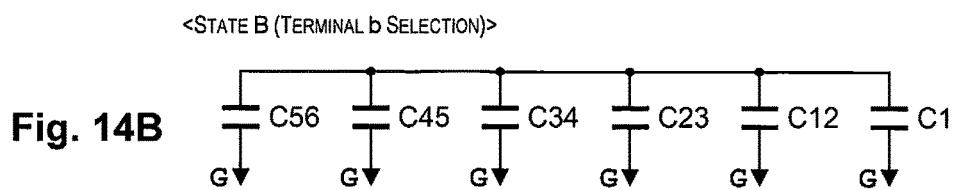

FIGS. 14A and 14B are drawings illustrating a state of connection of the switches in the auxiliary power source circuit 50.

Each of the switches takes one of two states, a state (state A) where the shared terminal is connected to the terminal a or a state (state B) where the shared terminal is connected to the terminal b, depending on the control signals A/B. FIGS. 14A and 14B provide a simplified illustration, with equivalent circuitry, of the connections in the state A and the connections in the state B, respectively, in the auxiliary power source circuit 50.

In the state A, the capacitive elements C56, C45, C34, C23, C12, C1 are connected in series, from the voltage $V_H$ until the ground G. In the state B, the one ends of the capacitive elements C56, C45, C34, C23, C12, C1 are connected to one another, and therefore the capacitive elements are connected in parallel, and the holding voltage is equalized.

As such, when the states A, B are alternately repeated, then the voltage $V_H/6$, which was equalized during the state B, is increased by a factor of one to five by the series connection of the state A and respectively held in the capacitive elements C1 to C5; the holding voltage of this time is supplied to the drivers 30 via the power source wirings 511 to 515.

Herein, when the piezoelectric elements 40 are charged by the drivers 30, a decrease in the holding voltages does appear among the capacitive elements C1 to C5. The capacitive elements for which the holding voltage has dropped are resupplied with charge from the power source by the series connection of the state A, along with equalization with redistribution by the parallel connection of the state B, and therefore a balance is struck so as to stay at the voltages $V_H/6$, $2V_H/6$, $3V_H/6$, $4V_H/6$, $5V_H/6$ when viewed in terms of the auxiliary power source circuit 50 overall.

In turn, when the piezoelectric elements 40 are discharged by the drivers 30, a rise in the holding voltage does appear among the capacitive elements C1 to C5, but the charge is sent out by the series connection of the state A, along with equalization with redistribution by the parallel connection of the state B, and therefore a balance is struck so as to stay at the voltages $V_H/6$, $2V_H/6$, $3V_H/6$, $4V_H/6$, $5V_H/6$ when viewed in terms of the auxiliary power source circuit 50 overall. When the charge that is sent out cannot be absorbed by the capacitive elements C56, C45, C34, C23, C12, C1 and remains in excess, the excess charge is absorbed by the capacitive element C6, i.e., is regenerated to the power supply system. For this reason, when there is any other load beyond the piezoelectric elements 40, the charge is used to drive this load. When there is no other load, the charge is absorbed by the other capacitive elements, including the capacitive element C6, and therefore the power source voltage $V_H$ rises, i.e., rippling occurs, but increasing the capacitance of the coupling capacitors, including the capacitive element C6, makes it possible to avoid this in practical usage.

When the voltages $V_H/6$, $2V_H/6$, $3V_H/6$, $4V_H/6$, $5V_H/6$ generated by the auxiliary power source circuit 50 of such description are supplied to the drivers 30, power consumption can be reduced, in addition to the following advantages as well. Namely, even when the voltage $V_H$ supplied from the main power source circuit 180 is modified, the voltages $V_H/6$, $2V_H/6$, $3V_H/6$, $4V_H/6$, $5V_H/6$ are modified in accordance with the modified voltage $V_H$.

Figure 15A:
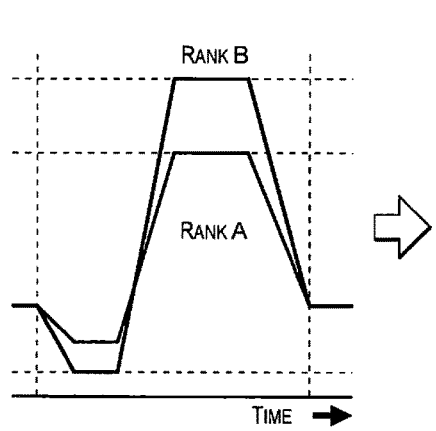
FIGS. 15A and 15B are drawings illustrating a voltage modification of an auxiliary power source circuit.

The amplitude of the power source voltage $V_H$ has the quality of needing to be set according to the individual performance of the piezoelectric elements 40. For this reason, with high-performing (high-efficiency) piezoelectric elements 40, it suffices to drive at a relatively low amplitude, as illustrated by the rank A in FIG. 15A. By contrast, with low-performing (low-efficiency) piezoelectric elements 40, it is necessary to drive at a relatively large amplitude, as illustrated by the rank B.

In order to drive piezoelectric elements 40 of both ranks A and B, the loss is increased when the voltage $V_H$ is fixed to a higher state in accordance with the rank B. It is particularly wasteful when the rank A, which is adequate at a low amplitude, is being driven.

Figure 15B:
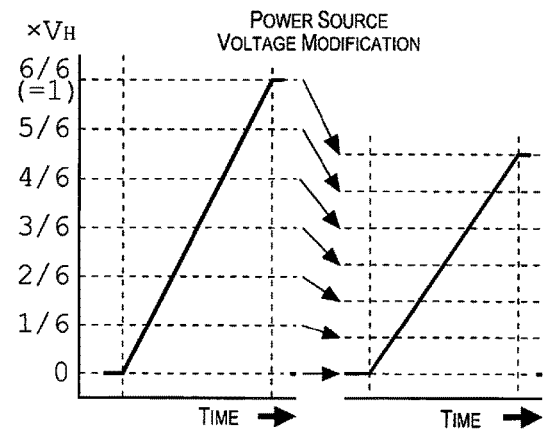

Accordingly, when the voltage $V_H$ is properly set according to the performance (efficiency) of the piezoelectric elements 40, as illustrated in FIG. 15B, wasteful loss can be minimized, in particular even when the rank A is being driven.

With the auxiliary power source circuit 50, when the piezoelectric elements 40 are being discharged by the drivers 30, the holding voltage of any of the capacitive elements C1 to C6 corresponding to the power source wiring being used for this discharging may temporarily rise, but repeating between the states A and B strikes a balance so as to hold a multiplication voltage of a factor of one to six of the voltage $V_H/6$. Similarly, when the piezoelectric elements 40 are being charged by the drivers 30, the holding voltage of any of the capacitive elements C1 to C6 corresponding to the power source wiring being used for this charging may temporarily lower, but repeating between the states A and B strikes a balance so as to hold a multiplication voltage of a factor of one to six of the voltage $V_H/6$.

As will be understood by viewing the voltage waveform of the control signals COM (Vin) in FIG. 3, the voltage rise for drawing in the ink and the voltage drop for discharging the ink are a set, and this set is repeated in the print operation. For this reason, with the auxiliary power source circuit 50, the charge that is recovered by the discharging of the piezoelectric element 40 is used in charging in the next and subsequent rounds.

As such, in the present embodiment, when the print apparatus 1 is viewed as a whole, the recovery and reuse of the charge discharged from the piezoelectric elements 40 and the stepwise charging and discharging in the drivers 30 (see FIGS. 15A and 15B) make it possible to keep power consumption low.

In the auxiliary power source circuit 50, when the shared terminals of each of the switches are switched from connection to one of the terminals a, b to the other, should there be a property variance in a plurality of (in FIG. 13, ten) switches, then in some instances there could be a state where the switching is not done in unison, resulting in a short-circuiting of both ends of the capacitive elements. For example, when the terminals a are connected to the shared terminal at the switches Sw1u, Sw1d, Sw2d during switching, should there occur a state where the terminal b is connected to the shared terminal at the switch Sw2u, then both ends of the series connection between the capacitive elements C12, C23 would end up short-circuiting.

For this reason, the configuration is preferably such that during switching of the switches, the occurrence of such short-circuiting is minimized through a neutral state in which there is temporarily no connection to the terminals a, b.

Application/Modification Examples

The present invention is not limited by the embodiment described above, but rather, a variety of applications and modifications, such as shall be described below by way of example, are possible. One or a plurality of arbitrarily selected modes of application or modification described below can also be combined as appropriate.

Negative Feedback Control

Figure 16:
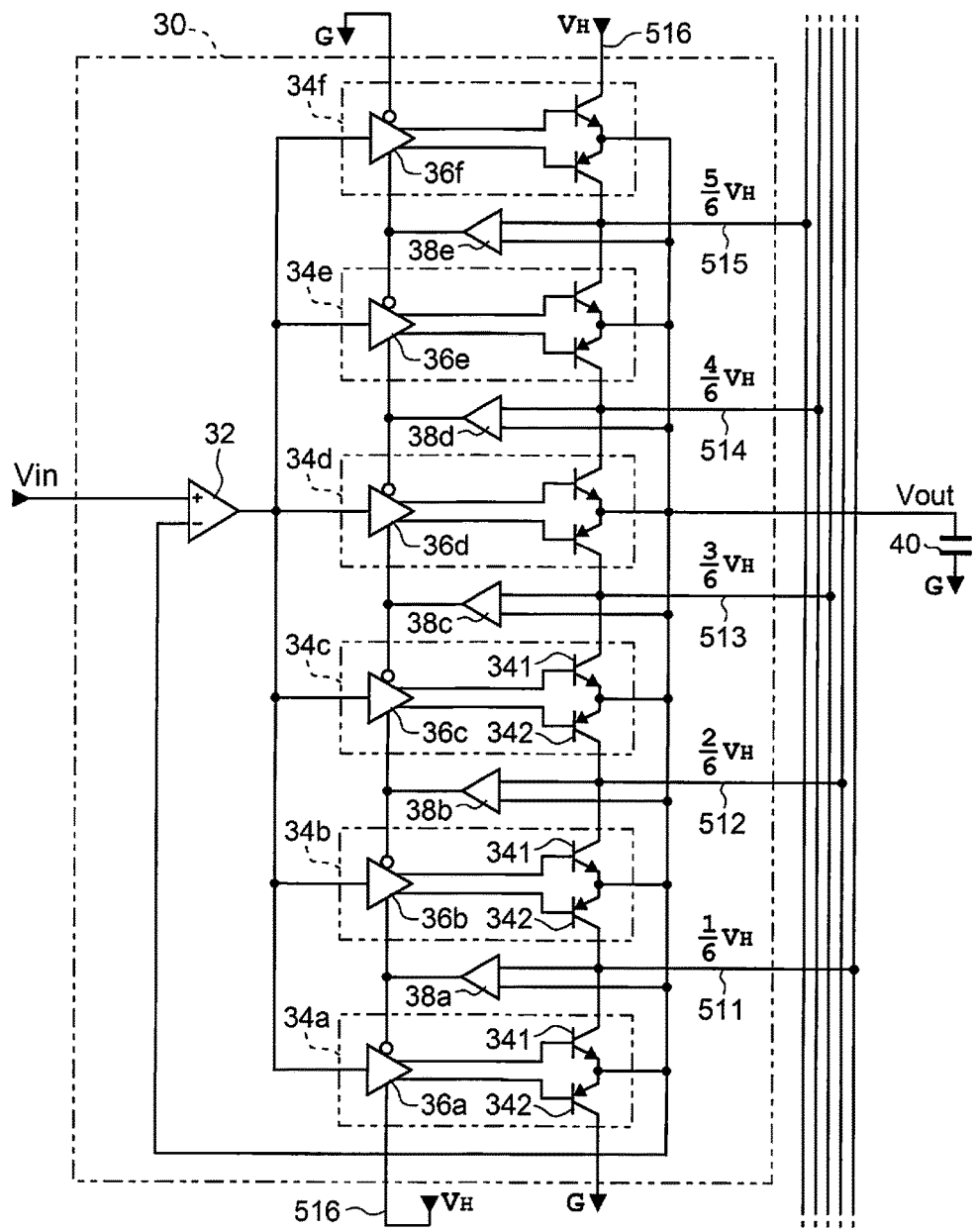
FIG. 16 is a drawing illustrating one example of the configuration of a (first) example of application of a driver.

FIG. 16 is a drawing illustrating one example of the configuration of the driver 30 as in a (first) example of application of the embodiment. As illustrated in FIG. 16, this example of application takes a configuration in which the voltage Vout of one end of the piezoelectric element 40 is negatively fed back to the input end (−) of the operational amplifier 32. With this configuration, when a difference exists between the voltage of the control signal Vout and the voltage Vout, then the transistors 341, 342 are controlled in a direction that eliminates this difference. For this reason, even in a case where the response properties of the level shifters 36a to 36f or the transistors 341, 342 are poor, the voltage Vout can be made to relatively quickly and very precisely track the control signal Vin.

Regarding the amount of negative feedback, the configuration preferably allows for property setting in accordance with the properties of the level shifters 36a to 36f and the transistors 341, 342. For example, in the depicted example, the operational amplifier 32 is configured to output a voltage obtained by subtracting the voltage Vout from the voltage of the control signal Vin, but the configuration may be such that this subtracted voltage is multiplied by an appropriate factor and then supplied to the level shifters 36a to 36f.

Figure 17:
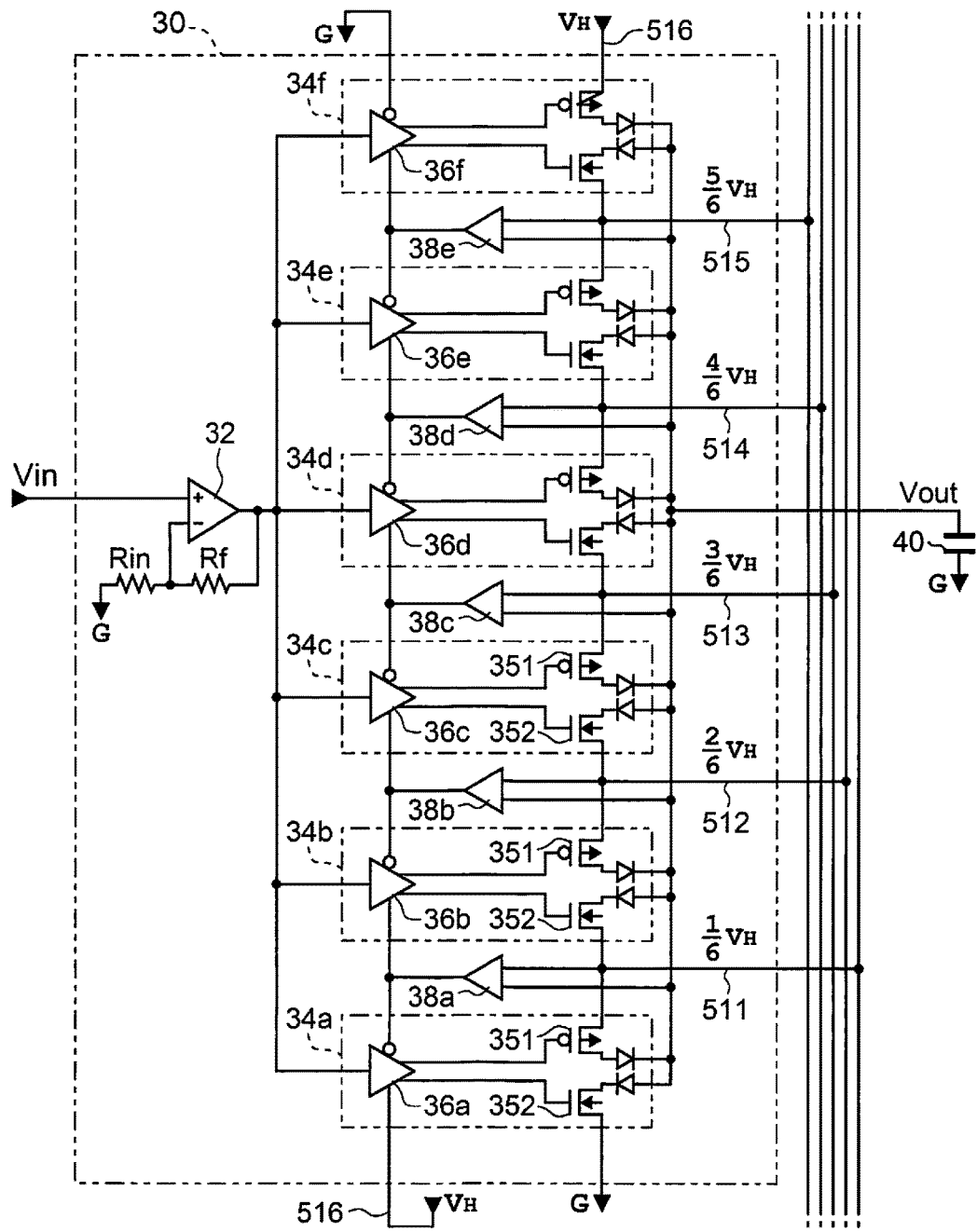
FIG. 17 is a drawing illustrating one example of the configuration of a (second) example of application of a driver.

FIG. 17 is a drawing illustrating one example of a configuration of the driver 30 as in another (second) example of application of the embodiment. In the driver 30 described in FIG. 5, the transistors 341, 342 of the unit circuits 34a to 34f were of a bipolar type, but in the (second) example of application illustrated in FIG. 17, the transistors 341, 342 are made to be Metal-Oxide-Semiconductor Field-Effect Transistors (MOSFETs) 351, 352 of a P- or N-channel type, respectively.

In the case where the MOSFETs 351, 352 are used, it suffices to provide diodes for preventing reverse current between each of the drain terminals and the one end of the piezoelectric element 40. Also, regarding the level shifters 36a to 36f in the case where the MOSFETs 351, 352 are used, the configuration is such that when the enable state is in effect, the voltage of the control signal Vin is shifted by an amount equivalent to a threshold voltage, as the predetermined value, in the minus direction and then the shifted voltage is supplied to a gate terminal of the MOSFET 351 of the P-channel type, and in turn the voltage of the control signal Vin is shifted by an amount equivalent to a threshold voltage, as the predetermined value, in the plus direction and then the shifted voltage is supplied to a gate terminal of the MOSFET 352 of the N-channel type.

A configuration, such as is illustrated in FIG. 16, in which the voltage Vout is negatively fed back may also be applied in the case where the MOSFETs 351, 352 are used.

Driven Objects

The embodiment described the example of piezoelectric elements 40 for discharging ink as the driven objects of the drivers 30. The present invention is not limited to the piezoelectric elements 40 as the driven objects, and may be applied to any and all loads that have a capacitive component, such as, for example, an ultrasonic motor, a touch panel, a flat speaker, or a liquid crystal or other kind of display.

Number of Stages of Unit Circuits

The embodiment had a configuration in which six stages of unit circuits 34a to 34f are provided in ascending order of voltage, so as to correspond to two mutually adjacent voltages out of the seven types of voltages, but in the present invention, the number of stages of unit circuits is not limited thereto, and need only be two stages or more. The voltages, too, need not necessarily be evenly spaced.

Comparators

The embodiment had a configuration in which, for example, the first state is detected as being in effect when the determination result of the comparator 38a is false (when the output signal is the L level) and the second state is detected as being in effect when the determination result of the comparator 38a is true (the output level is the H level) and the determination result of the comparator 38b is false. That is to say, the configuration for detecting the first state and second state is a configuration of partial overlap, not separation from one another, and a configuration in which the first state to sixth state are detected with the entirety of the comparators 38a to 38e. There is no limitation thereto, and the configuration may also be one where each of the states is detected individually.

Level Shifters in Disable State

The embodiment has a configuration in which the level shifters 36a to 36f, which in the disable state, supply voltage zero to the base (gate) terminals of the transistors 341 (351) and supply the voltage $V_H$ to the base (gate) terminals of the transistors 342 (352), but there is no limitation thereto, provided that the transistors 341, 342 can be turned off. For example, the configuration may be one where the level shifters 36a to 36f, when in the disable state, supply an off signal, obtained by shifting the voltage of the control signal Vin in the plus direction, to the base (gate) terminals of the transistors 341 (351) and supply an off signal, obtained by shifting the voltage of the control signal Vin in the minus direction, to the base (gate) terminals of the transistors 342 (352).

According to this configuration, the breakdown voltage of the transistors 341 (351), 342 (352) is lower, and therefore it is possible to reduce the transistor size of when transistors are being formed on the semiconductor substrate.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A capacitive load driving circuit for repeating between charging and discharging for a capacitive load, the capacitive load driving circuit comprising:
   a charge supply source;
   a first signal path through which a first voltage is applied by the charge supply source;
   a second signal path through which a second voltage higher than the first voltage is applied by the charge supply source;
   a detector configured and arranged to detect whether or not a holding voltage of the capacitive load is less than the first voltage, or whether or not the holding voltage of the capacitive load is equal to or greater than the first voltage and less than the second voltage; and
   a connection path selector configured to electrically connect the capacitive load and the charge supply source via at least one of the first signal path and the second signal path, in accordance with a control signal,
   the charge supply source being arranged and configured to supply voltage to the connection path selector.

2. The capacitive load driving circuit as set forth in claim 1, wherein
   the connection path selector is configured to
      when a holding voltage of the capacitive load is less than the first voltage, control a charge with which the capacitive load is charged via the first signal path, in conformity with a voltage of the control signal, and
      when the holding voltage of the capacitive load is equal to or greater than the first voltage and less than the second voltage, control a charge discharged from the capacitive load via the first signal path or a charge with which the capacitive load is charged via the second signal path, in accordance with the voltage of the control signal.

3. The capacitive load driving circuit as set forth in claim 1, further comprising:
   a first transistor, a second transistor, and a third transistor, wherein
   when a holding voltage of the capacitive load is less than the first voltage, the first transistor is configured and arranged to control a charge with which the capacitive load is charged via the first signal path in accordance with a voltage obtained when a voltage of the control signal is shifted by a predetermined value to a low side,
   when the holding voltage of the capacitive load is equal to or greater than the first voltage and less than the second voltage, the second transistor is configured to control a charge discharged from the capacitive load via the first signal path in accordance with a voltage obtained when the voltage of the control signal is shifted by the predetermined value to a high side, and
   the third transistor is configured to control a charge with which the piezoelectric element is charged via the second signal path in accordance with a voltage obtained when the voltage of the control signal is shifted by the predetermined value to the low side.

4. The capacitive load driving circuit as set forth in claim 3, wherein
   when the holding voltage of the capacitive load is not less than the first voltage, the first transistor is off, and
   when the holding voltage of the capacitive load is not equal to or greater than the first voltage and less than the second voltage, the second transistor and the third transistor are off.

5. The capacitive load driving circuit as set forth in claim 2, wherein
   the charge with which the capacitive load is charged or the charge discharged from the capacitive load driving circuit is controlled at a voltage obtained when a voltage found by subtracting a voltage held by the capacitive load driving circuit from the voltage of the control signal is multiplied by a predetermined number.

6. The capacitive load driving circuit as set forth in claim 1, wherein
   the connection path selector includes a plurality of connection path selectors, and
   the charge supply source is arranged and configured to equally supply voltage to the plurality of connection path selectors.

* * * * *